(12) United States Patent
Haji-Sheikh et al.

(10) Patent No.: US 7,700,379 B2
(45) Date of Patent: Apr. 20, 2010

(54) METHODS OF CONDUCTING WAFER LEVEL BURN-IN OF ELECTRONIC DEVICES

(75) Inventors: Michael J. Haji-Sheikh, Dekalb, IL (US); James R. Biard, Richardson, TX (US); Simon Rabinovich, Plano, TX (US); James K. Guenter, Garland, TX (US); Bobby M. Hawkins, Wylie, TX (US)

(73) Assignee: Finisar Corporation, Sunnyvale, CA (US)

( * ) Notice: Subject to any disclaimer, the term of this patent is extended or adjusted under 35 U.S.C. 154(b) by 639 days.

(21) Appl. No.: 10/486,661

(22) PCT Filed: Aug. 12, 2002

(86) PCT No.: PCT/US02/25640

§ 371 (c)(1),
(2), (4) Date: Apr. 22, 2005

(87) PCT Pub. No.: WO03/017326

PCT Pub. Date: Feb. 27, 2003

(65) Prior Publication Data

US 2006/0097337 A1 May 11, 2006

Related U.S. Application Data

(60) Provisional application No. 60/311,916, filed on Aug. 13, 2001.

(51) Int. Cl.
*H01L 21/66* (2006.01)
*G01R 31/26* (2006.01)

(52) U.S. Cl. .............................. 438/14; 438/5; 438/10; 438/17; 257/E21.521

(58) Field of Classification Search .................... 438/5, 438/10, 11, 14, 17, 18; 257/E21.521
See application file for complete search history.

(56) References Cited

U.S. PATENT DOCUMENTS 4,276,098 A 6/1981 Nelson et al.

(Continued)

FOREIGN PATENT DOCUMENTS

CN 1045138 9/1999

(Continued)

OTHER PUBLICATIONS

"Full-Wafer Burn-In of Diode Lasers," IBM Technical Disclosure Bulletin, IBM Corp., New York, US, vol. 35, No. 4A, Sep. 1, 1992, p. 488.

(Continued)

*Primary Examiner*—Charles D Garber
*Assistant Examiner*—Angel Roman
(74) *Attorney, Agent, or Firm*—Workman Nydegger

(57) ABSTRACT

Methods of conducting wafer level burn-in (WLBI) of semiconductor devices are presented wherein systems are provided having at least two electrodes (210, 215). Electrical bias (920) and/or thermal power (925) is applied on each side of a wafer (100) having back and front electrical contacts for semiconductor devices borne by the wafer. A pliable conductive layer (910) is described for supplying pins on the device side of a wafer with electrical contact and/or also for providing protection to the wafer from mechanical pressure being applied to its surfaces. Use of a cooling system (950) is also described for enabling the application of a uniform temperature to a wafer undergoing burn-in. Wafer level burn-in is performed by applying electrical and physical contact (915) using an upper contact plate to individual contacts for the semiconductor devices; applying electrical and physical contact using a lower contact plate (910) to a substrate surface of said semiconductor wafer; providing electrical power (920) to said semiconductor devices through said upper and lower second contact plates from a power source coupled to said upper and lower contacts plates; monitoring and controlling electrical power (935) to said semiconductor devices for a period in accordance with a specified burn-in criteria; removing electrical power at completion of said period (955); and removing electrical and physical contact to said semiconductor wafer (965).

28 Claims, 18 Drawing Sheets

U.S. PATENT DOCUMENTS

| | | | |
|---|---|---|---|
| 4,860,079 A | 8/1989 | Turner | |
| 5,428,298 A | 6/1995 | Ko | 324/762 |
| 5,513,200 A | 4/1996 | Paoli | |
| 5,570,032 A | 10/1996 | Atkins et al. | 324/760 |
| 5,719,891 A | 2/1998 | Jewell | |
| 5,886,535 A * | 3/1999 | Budnaitis | 324/760 |
| 5,929,651 A * | 7/1999 | Leas et al. | 324/765 |
| 6,184,053 B1 | 2/2001 | Eldridge et al. | |
| 6,204,074 B1 | 3/2001 | Bertolet et al. | |
| 6,222,206 B1 | 4/2001 | Chirovsky | |
| 6,229,329 B1 | 5/2001 | Nakata et al. | 324/765 |
| 6,265,888 B1 * | 7/2001 | Hsu | 324/760 |
| 6,273,400 B1 | 8/2001 | Kuchta | |
| 6,340,302 B1 * | 1/2002 | Ladd | 439/40 |
| 6,351,134 B2 | 2/2002 | Leas et al. | |
| 6,407,563 B2 | 6/2002 | Ohtaki | |
| 6,522,156 B2 * | 2/2003 | Tustaniwskyj et al. | 324/754 |
| 6,549,026 B1 | 4/2003 | DiBattista et al. | |
| 6,623,997 B2 * | 9/2003 | Chang et al. | 438/18 |
| 6,737,879 B2 * | 5/2004 | Johnson | 324/755 |
| 6,771,086 B2 | 8/2004 | Lutz et al. | |
| 6,842,029 B2 | 1/2005 | Howland | |
| 7,190,184 B2 * | 3/2007 | Haji-Sheikh et al. | 324/760 |

FOREIGN PATENT DOCUMENTS

| | | |
|---|---|---|
| DE | 42 23 658 A1 | 1/1993 |
| EP | 0 841 572 A1 | 5/1998 |
| GB | 2347558 | 9/2000 |
| JP | 03-089528 | 4/1991 |
| JP | 04-262551 | 9/1992 |
| JP | 05029418 A | 2/1993 |
| JP | 08-037215 | 6/1996 |
| JP | 10-144750 | 5/1998 |
| JP | 10-178074 | 6/1998 |
| JP | 10178074 | 6/1998 |
| JP | 2000-065862 | 3/2000 |
| JP | 2000111576 | 4/2000 |
| JP | 2000-258495 | 9/2000 |
| JP | 2001050983 | 2/2001 |
| JP | 2001-159643 | 6/2001 |
| WO | 9858266 | 12/1998 |

OTHER PUBLICATIONS

U.S. Appl. No. 10/486,666, filed Jul. 10, 2008, Final Office Action.

U.S. Appl. No. 10/486,665, filed Sep. 21, 2007, Non-Final Office Action.

U.S. Appl. No. 10/486,665, filed May 28, 2008, Final Office Action.

* cited by examiner

| What | Description (example) |
|---|---|
| Product/Device Number | Chip Device Part Number |
| Work Order Number | From Route Sheet |
| Wafer lot Number | Lot Number (24200) |
| Wafer Number | Wafer # in Lot (-1 to -12 typical) |
| Wafer Bias Current | Table 1 Spec (120 to 480 Amps typical) |
| Power Supply Sense Voltage (Vs) | Record Start Voltage (when 100°C reached) Should be 1.50 < voltage < 3.00 Volts |
| Burn-in Temperature | Record Start Wafer Substrate Temperature |
| Burn-in Supply Current | Record Start Bias Current (sum of the two power supply current displays) |
| Date | Date Burn-in Started (01/01/01) |
| Time | Time Burn-in Started (when substrate Temperature reaches 100°C) |
| Operator | Your Name, Initials ok (BHM) |
| Quantity Started | Number Wafers Started (normally one) |
| Quantity Passed | Number Wafers Good After Processing (normally one unless broken) |
| Burn-in System Number | Enter System Number Label on Apparatus |

*Fig. 10*

METHODS OF CONDUCTING WAFER LEVEL BURN-IN OF ELECTRONIC DEVICES

This invention claims priority to U.S. provisional patent application Ser. No. 60/311,916, entitled "METHODS OF AND SYSTEMS FOR WAFER LEVEL BURN-IN OF ELECTRONIC DEVICES" filed Aug. 13, 2001.

TECHNICAL FIELD

This invention relates to thermal and electrical burn-in of electronic devices. More particularly the present invention relates to wafer level burn-in methods applicable to components of the semiconductor industry through use of two electrical contacts in contact with opposite sides of a wafer. The present invention is also related to wafer level burn-in of vertical cavity surface emitting lasers (VCSELs).

BACKGROUND OF THE INVENTION

Solid-state semiconductor devices are found in most electronic components today. For example, semiconductor lasers are important devices in applications such as opto-electronic communication systems and high-speed printing systems. There continues to be increased interest in vertical cavity surface emitting lasers (VCSELs) although edge emitting lasers are currently used in the vast majority of applications. A reason for the interest in VCSELs is that edge-emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. On the other hand, not only does the beam of a VCSEL have a small angular divergence, a VCSEL emits light normal to the surface of the wafer. In addition, since VCSELs incorporate the mirrors monolithically in their design, they allow for on-wafer testing and the fabrication of one-dimensional or two-dimensional laser arrays. It is common for more than 60,000 semiconductor laser components to be fabricated on a single wafer.

VCSELs are typically made by growing several layers of reflective material on a substrate material. VCSELs include a first mirrored stack, formed on the substrate by semiconductor manufacturing techniques, an active region formed on top of the first mirrored stack, and a second mirrored stack formed on top of the active region. By providing a first contact on top of the second mirrored stack, and a second contact on the backside of the substrate, a current is forced through the active region, thus driving the VCSEL. VCSELs can be fabricated/grown with combinations of gallium, arsinide, nitrogen, aluminum, antimony, phosphorous and/or indium placed within or about a typical GaAs substrate.

Historically, the manufacturing of semiconductors has been a very elaborate and expensive multi-step process. Component burn-in generally refers to the process of thermally and/or electrically testing newly fabricated semiconductor components. Burn-in allows for the individual identification of faulty components that may develop within a lot or batch of semiconductor devices. Currently, components are burned-in at the "package level", which means that the individually packaged devices are typically tested after being derived from a wafer. Each component is tested and placed in sockets to be burned-in either as a packaged unit or to be tested as bare die (before packaging). Either die or package level burn-in can be costly for manufacturers because it is labor intensive. Each component has to be tested, requiring plenary human intervention.

Although wafer level burn-in (WLBI) methods and systems are currently being explored by the semiconductor industry, proposed systems and methods generally require that a plurality of electrical probes contact a plurality of electrical contacts on a wafer. Such systems can be complex and require extra care with regard to probe and contact alignment. For example, U.S. Pat. No. 6,339,329 issued to Nakata et al., entitled "Method of testing electrical characteristics of multiple semiconductor integrated circuits simultaneously", is typical of the technological direction being taken in the industry for WLBI. The Nakata et al. patent teaches simultaneous testing of a plurality of semiconductor integrated circuit elements by bringing a plurality of probe terminals into contact with a plurality of testing electrodes associated respectively with a plurality of semiconductor integrated circuit elements on a wafer and applying a voltage to each of the testing electrodes from the common voltage supply line via a plurality of positive temperature coefficient elements.

The semiconductor fabrication industry needs methods and systems for reducing the costs and associated labor currently required to carry out device burn-in. Further, the semiconductor industry needs a wafer level burn-in (WLBI) method and systems that can be used in the manufacturing and test of semiconductor components having front and back contacts, such as VCSELs, diodes, LEDs, and other semiconductor devices. The present inventors have recognized that it would be advantageous to remedy current burn-in procedures by providing methods and systems of accomplishing wafer level burn-in of components. Accordingly, the present invention is described and presented as a novel method and means to address the shortcomings currently found in the art.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole. Additional objects and advantages of the current invention will become apparent to one of ordinary skill in the art upon reading the specification.

It is a feature of the present invention to provide methods of conducting wafer level burn-in of semiconductor devices.

It is a feature of the present invention to provide methods of using a WLBI system that includes top and bottom contact plates for making electrical contact with a semiconductor wafer having front and back contacts.

It is another feature of the present invention to provide methods of using a WLBI system that includes a heat exchanger for assisting in the regulation of wafer temperature during burn-in procedures.

It is another feature of the present invention to optionally provide for use of a graphite foil for facilitating contact between contact plates and/or wafer contacts.

It is another feature of the present invention to provide for use of an electrical power regulator for providing current and voltage through components on a wafer undergoing a burn-in procedure.

It is another feature of the present invention to provide for use of monitoring and automated adjustment apparatuses necessary for maintaining current and temperature level requirements during wafer level burn-in.

It is another feature of the present invention to provide for use of a wafer level burn-in system including wafer support hardware for providing mechanical retention of a wafer undergoing burn-in procedures.

It is yet another feature of the present invention to provide for use of a wafer support that provides controlled mechanical clamping force, electrical contact and temperature interface to a wafer undergoing burn-in procedures.

It is another feature of the present invention to provide methods of achieving wafer level burn-in for semiconductor devices wherein a wafer containing semiconductor devices is fabricated, undergoes wafer level burn-in, individual devices are derived from the wafer after burn-in, and operational devices are made available for use (shipment).

It is still another feature of the present invention to provide wafer level burn-in methods including consistent application of electrical power to wafer-borne devices during a wafer level burn-in procedure.

It is another feature of the present invention to provide wafer level burn-in methods including consistent application of thermal temperature to wafer-borne devices during a wafer level burn-in procedure.

It is another feature of the present invention to provide wafer level burn-in methods including consistent application of electrical power and thermal temperature to wafer-borne devices during a wafer level burn-in procedure.

Wafer level burn-in reduces the need for package level burn-in and reduces component production costs. A WLBI system having two distinct plates serving as electrodes for the application of electrical bias on each side of a wafer having back and front electrical contacts for semiconductor devices borne by the wafer is described. Furthermore, a pliable conductive layer, such as a graphite, felt-like material that can appear disk-like in form, is described for simultaneously supplying pins on the device side and/or substrate side of a wafer with electrical contact. The pliable conductive layer can allow for an effective series resistance, R, in each of the devices borne by the wafer, thus helping maintain voltage bias level consistent. The pliable conductive layer also prevents damage to the wafer when pressure is applied by chamber contacts onto the wafer during burn-in operations, because the pliable conductive layer can deform to absorb contact surfaces of the pins on the device side of a wafer. A cooling system is also described for enabling the application of a uniform temperature to a wafer undergoing burn-in.

Wafer level burn-in can be carried out by applying electrical and physical contact using a lower contact plate to a substrate surface of said semiconductor wafer; applying electrical and physical contact using an upper contact plate to individual contact for semiconductor devices borne by a semiconductor wafer; providing electrical power to said semiconductor devices through said upper and lower contact plates from a power source coupled to said upper and lower contacts plates; monitoring and controlling electrical power to said semiconductor devices for a period set forth in accordance with a specified burn-in criteria; removing electrical power at completion of said period; and removing electrical and physical contact to said semiconductor wafer.

BRIEF DESCRIPTION OF THE DRAWINGS

The accompanying figures, in which like reference numerals refer to identical or functionally-similar elements throughout the separate views and which are incorporated in and from part of the specification, further illustrate the present invention and, together with the detailed description of the invention, serve to explain the principles of the present invention.

FIG. 10 illustrates a sample log or record used during WLBI procedures in accordance with the present invention;

FIG. 18 illustrates another side perspective of upper and lower contact plates in contact with a wafer and conductive layer, wherein coolant and heating liquid are provided to upper and lower contact plate assemblies through liquid tubing and a spherical contact provides for leveling action to the upper plate with respect to the wafer being burned-in.

DETAILED DESCRIPTION OF THE INVENTION

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

The present invention replaces component, or device level, burn-in with new methods and systems that achieve burn-in results at much lower cost. This disclosure of the present invention teaches how to burn-in many wafer-based components simultaneously while the components are integrally part of the wafer, rather than using current processes known in the art that generally require the handling of one die/component at a time. Prior methods are generally more labor intensive. Furthermore, the present invention substantially reduces scrap devices resulting from post wafer burn-in operation.

Figure 1:
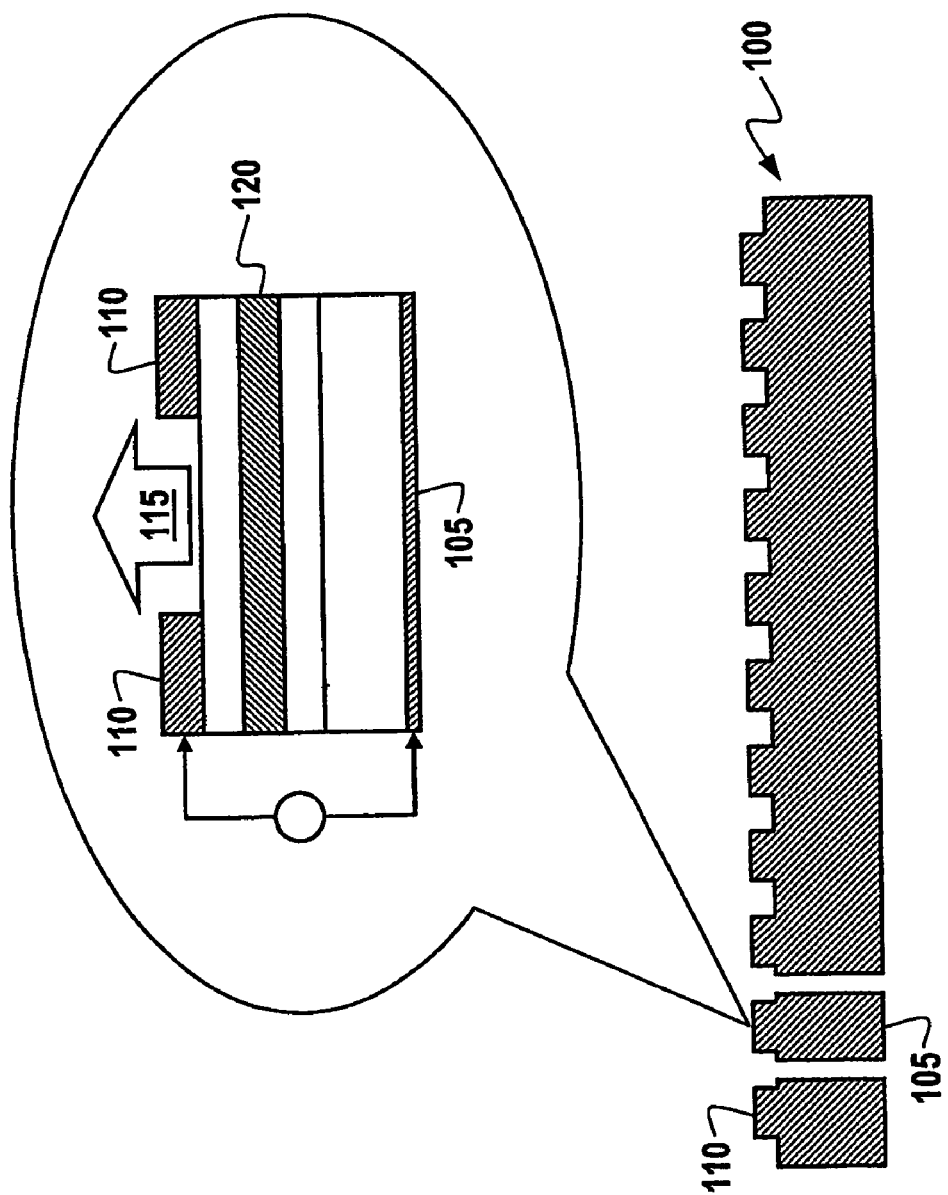
FIG. 1 is a blown-up illustration of a prior art semiconductor device having electrical contacts on the bottom and top layers, as well as a prior art illustration of a wafer containing a plurality of devices such as that shown in the blow-up illustration.

Referring to FIG. 1, an example of a prior art semiconductor device is shown as a blown-up illustration from its location on a wafer 100. The device illustrated in the blown-up portion generally exemplifies an active device, such as a VCSEL or LED. The active region 120 of the device, e.g., VCSEL, creates and amplifies light that is allowed to exit 115 through a window or opening on the surface of the device. Electrical potential is supplied to the device at a common contact 105 typically located on the bottom of the device and wafer and typically is used to apply negative electrical potential to the device. Common contact 105 can generally be associated with the substrate of the wafer 100. A second contact 110, generally used to apply positive (+) potential to the device, is typically located as the uppermost layer of the device. During device manufacturing, the device shown in the blow-up is cut from the wafer 100. Prior to the present invention, it has been normal practice to burn-in the individual wafer either before or after packaging. With the present invention all devices will now be able to undergo burn-in testing (thermal and electrical) without being separated from the wafer 100.

Figure 2:
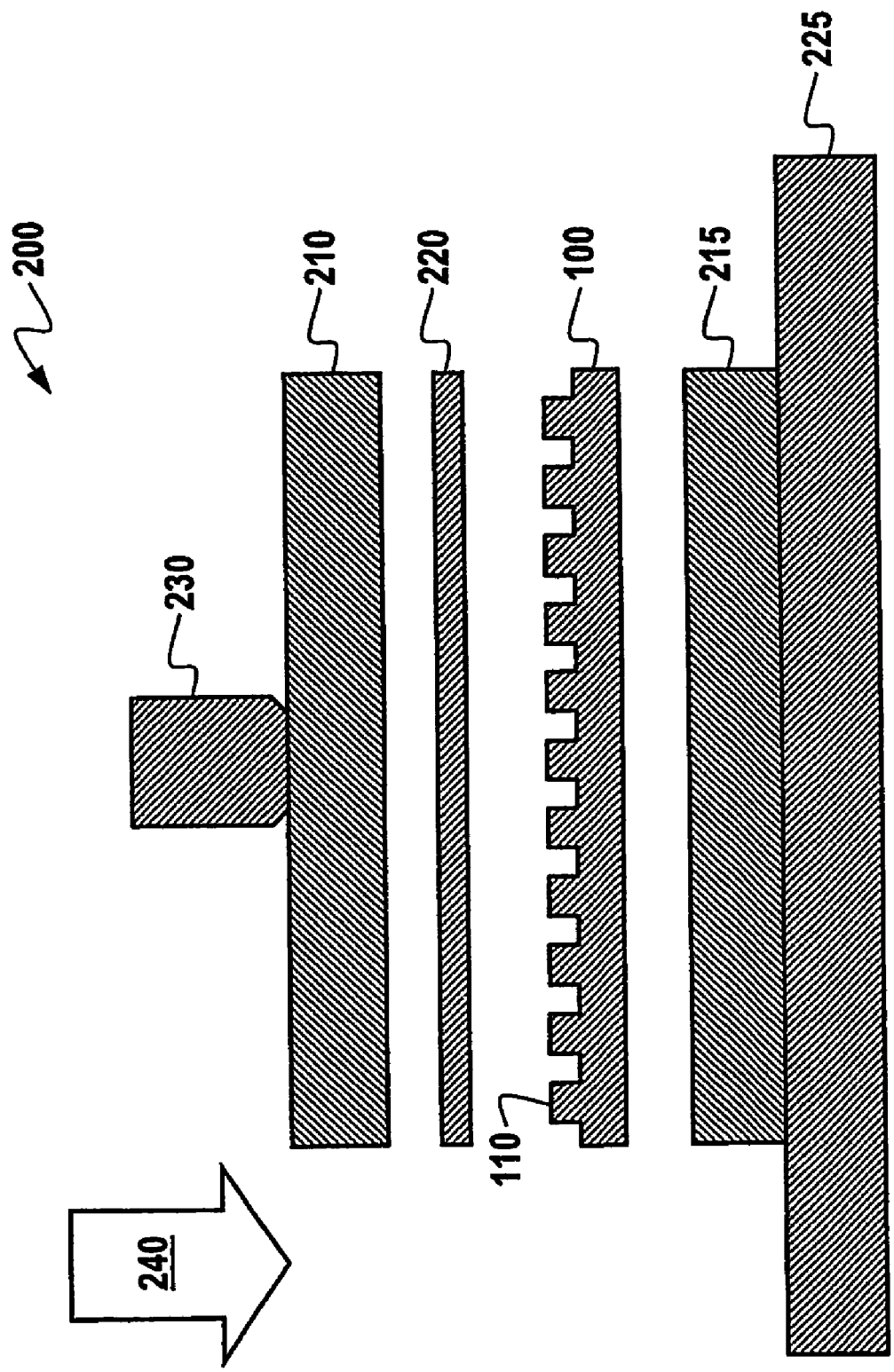
FIG. 2 is an illustration of one embodiment of the present invention wherein a system can supply electrical and thermal contact to/with a wafer, control physical application of pressure with a self-adjusting upper contact assembly, and regulate temperature with a heat exchanger.

Referring to FIG. 2, primary components used in an important embodiment of the present invention are shown. In a wafer level burn-in (WLBI) system 200, a wafer 100 is shown disposed between an upper contact plate 210 and lower contact plate 215. It should be appreciated that the system need only include two electrical contact plates, i.e., contact plates 210 and 215, although other electrical contacts can be used in accordance with the present invention. Further, it should be appreciated that a system could be devised to receive a semiconductor wafer vertically, in which case the upper contact plate 210 can be referred to as a first contact plate and the lower contact plate 215 can be referred to as a second contact plate. For purposes of the present detailed description, it will be assumed that WLBI systems will take advantage of gravity and, therefore, operate horizontally. Now, therefore, upper contact plate 210 and lower contact plate 215 are used to provide positive and negative electrical potential to the wafer 100. As previously shown in FIG. 1, common contact 105 (which can be the substrate of the wafer) provides electrical contact by lower contact plate 215. Upper contact plate 210 can provide electrical contact directly to each of the devices formed on the wafer 100 via their respective surface contacts 110.

It should be appreciated that variations on the upper surface (or device side) of the wafer 100 may develop during creation/processing of a wafer, or variations can also be formed on the surface of the upper contact plate 210, that may not allow for electrical potential to be applied to all devices on the wafer. In order to ensure that all devices are provided with electrical potential from the upper contact plate 210, a conductive and pliable layer 220 can be optionally introduced between the upper contact plate 210 and the wafer 100 via common contact 110. The pliable layer 220 can also reduce mechanical pressure on the device side of the wafer 100. Also, pliable layer 220 can be optionally introduced between the lower contact plate 215 and the wafer 100 via common contact 105, preventing excessive mechanical pressure on the wafer 100. The upper contact plate 210 can be controlled by a controller 230. The controller can allow the surface of upper contact plate 210 to be optimally oriented against the surface of the device contacts 110, or the pliable, conductive material 220 when used. The controller can provide for X-Y-Z orientation of the upper plate 210.

During the burn-in process, thermal energy 240 can be provided through the upper contact plate 210 directly to all device contacts 110 formed on the surface of the wafer 100. If an optional pliable layer 220 is used, thermal energy must also be sufficient to pass through it to the wafer 100. In order to maintain a constant burn-in temperature at the wafer during processing, a heat exchanger 225 can be used. The heat exchanger 225 can provide cooling action through the lower contact plate 215 to the wafer 100. The heat exchanger 225 may include heat sink material, liquid cooling, air cooling and other heat transfer methods known in the art to regulate a constant temperature at the wafer 100.

Figure 3:
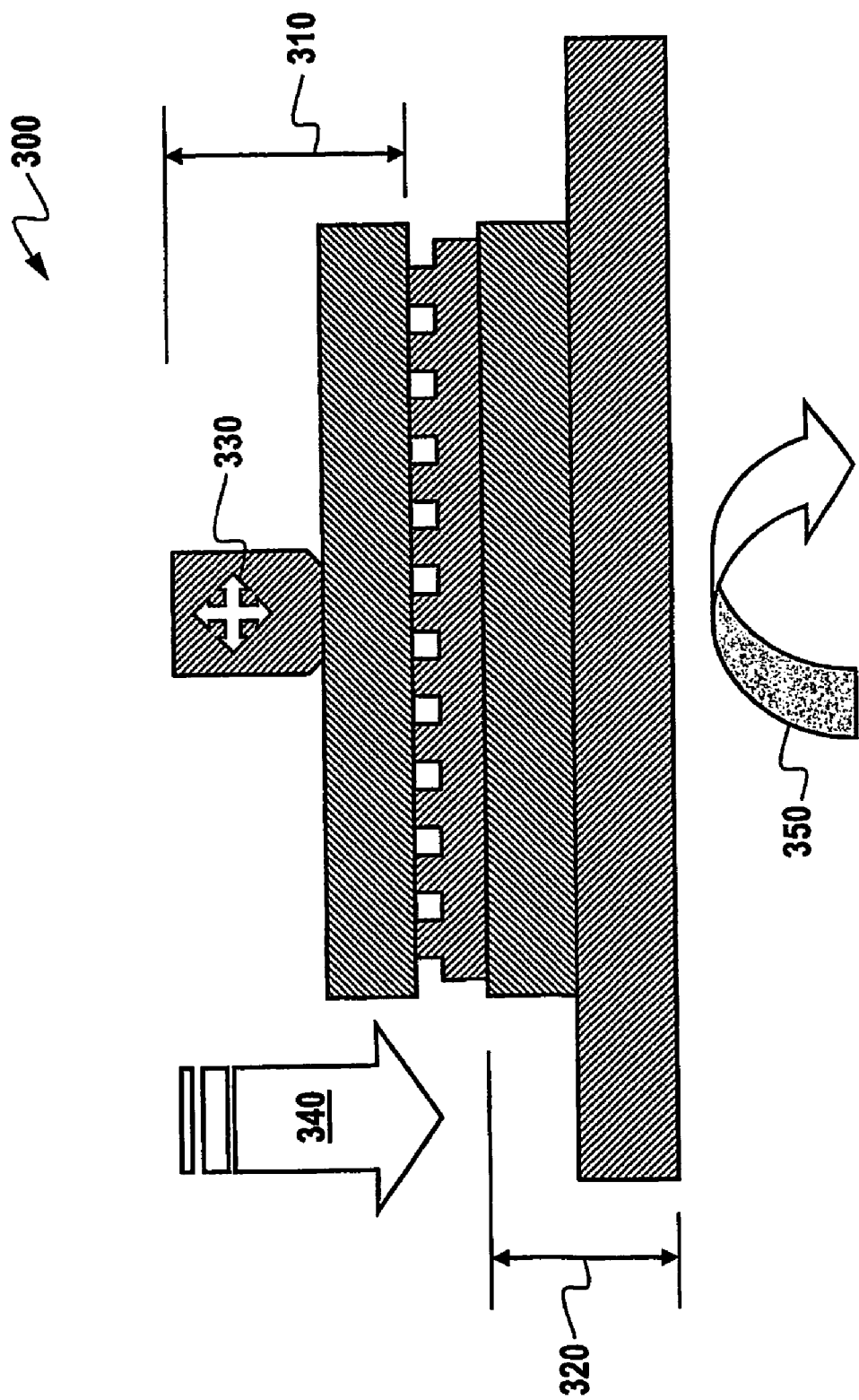
FIG. 3 is an illustration of another embodiment of the present invention wherein upper and lower contact assemblies are in contact with electrical contacts of a wafer; heat is shown flowing through the entire assembly, and heat is regulated around a set temperature by a heat exchanger.

Referring to FIG. 3, component placement of the system described in FIG. 2 is shown as it can be observed during operation. During burn-in testing, the upper contact portion 310 of the system is placed into contact with the upper surface (e.g., individual device contacts 110) of the wafer 100 or the pliable layer 220. In order to accomplish optimal placement of the upper contact portion 310 with the surface of the wafer 100, even when facilitated with the pliable layer 220, an upper adjustment mechanism 330 can allow the upper contact plate 210 to move, or "level", with respect to the wafer's surface. The pliable layer 220 can facilitate not only electrical contact with the device contacts on the wafer 100, but will also help in preventing mechanical pressure applied from the upper contact portion 310 that may damage the wafer or the individual devices on the wafer. Damage, such as fractures on the wafer or on the individual devices on the wafer, can be reduced or prevented because of the pliable nature of the pliable layer 220. Thermal regulation 350 can be accomplished through the lower contact portion 320 while thermal energy 340 is applied through the upper contact portion 310.

Figure 4:
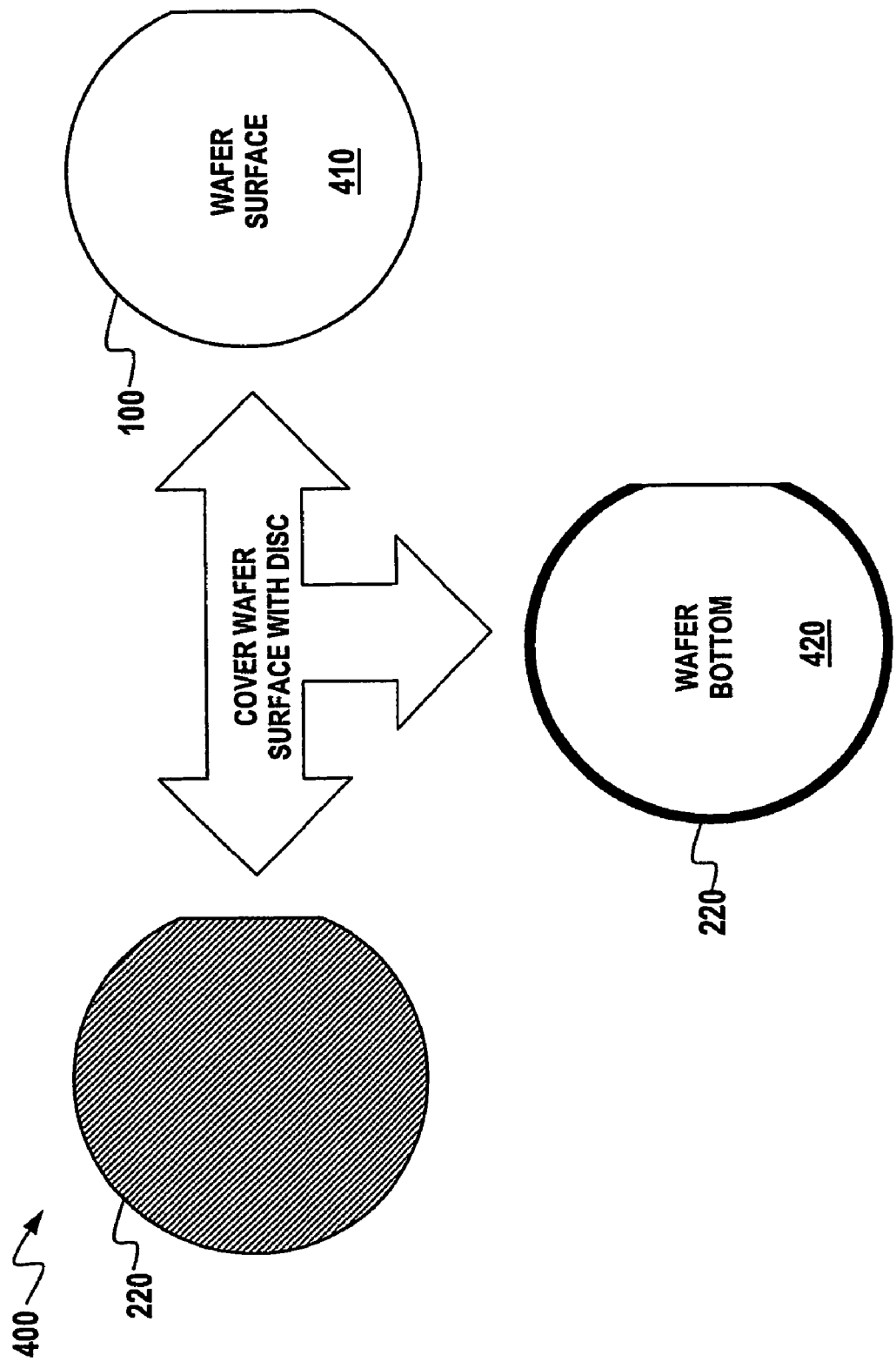
FIG. 4 is an illustration of a pliable wafer contacting material that is conductive, formed in a shape similar to a wafer such that it can be used to provide common electrical contact to semiconductors on the wafer, as well as the material covering the surface (device side) of the wafer (the bottom side of the wafer prominently showing)

Referring to FIG. 4, the pliable layer 220 and wafer 100 are shown. A wafer 100 undergoing burn-in procedures would be placed on top of the lower contact plate 215 shown in FIG. 2 with the wafer surface 410 facing upward toward the upper contact plate 210 of FIG. 2. The pliable layer 220 would then be placed on top of the wafer surface 410. The pliable layer 220 is preferably cut or formed so that it is generally shaped as a "disk" that is slightly larger than the outer perimeter of the wafer 100. A combination of pliable layer 220 and wafer bottom 420 is shown in FIG. 4, which illustrates the pliable layer 220 having a larger diameter than the diameter of the wafer 100.

When used, the pliable layer 220 should operate as an intermediate contact material that is electrically conductive, thermally conductive, and mechanically compressible. The pliable layer 220 should add sufficient electrical resistance to the burn-in circuit to minimize current flow variation die-to-die across the wafer 100. The pliable layer 220 must also be thermally conductive to transfer heat flow to/from the semiconductor wafer. The pliable layer 220 must be mechanically compressible to ensure uniform contact across non-uniform wafer and electrode surfaces and to prevent damage to the semiconductor wafer surfaces (upper and/or lower). Some materials that can be used include, but are not limited to, z-axis elastomers, conductive elastomers, conductive rubber, metal films, metal-impregnated polymer films, graphite discs, and sacrificial patterned metal. For example, a graphite foil disc referred to by Toyo Tanso USA of Troutdale, Oreg., the manufacturer and distributor, as PERMA FOIL can be cut from high purity graphite sheets. PERMA FOIL properties include:

Temperature Range: $-200°$ C. to $+3,300°$ C.
Compressibility (perpendicular to surface): 45%
Thermal Conductivity (parallel to surface): 120 Kcal/m. Hr° C.
Thermal Conductivity (perpendicular to surface): 4 Kcal/m. Hr° C.
Specific Electrical Resistance (parallel to surface): 900 $\mu\Omega$-cm
Specific Electrical Resistance (perpendicular to surface): 250,000 $\mu\Omega$-cm
Coefficient of Thermal Expansion (parallel to surface): $5\times10$-61° C.
Coefficient of Thermal Expansion (perpendicular to surface): $2\times10$-41° C.

Figure 5:
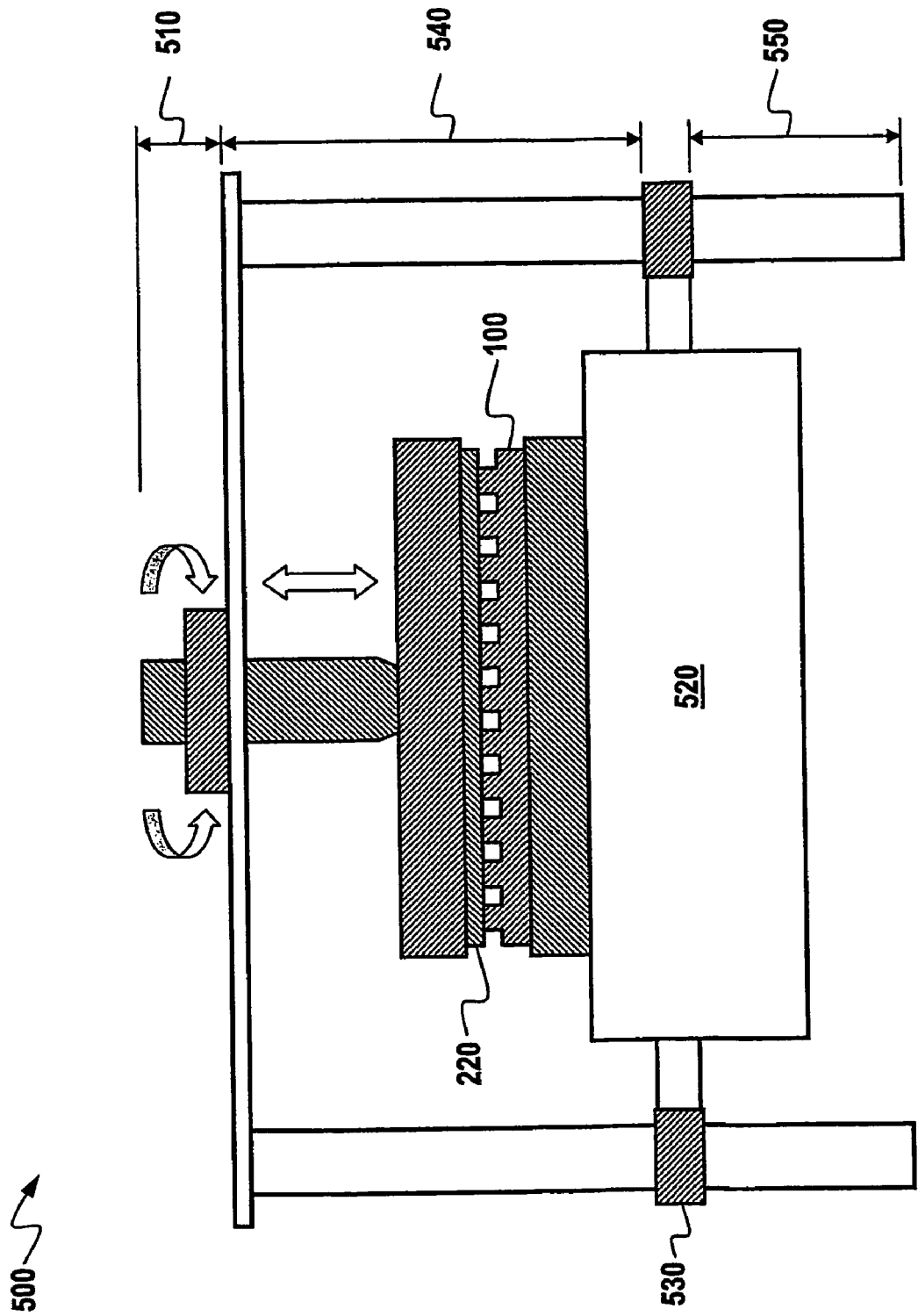
FIG. 5 is an illustration of another embodiment of the present invention wherein a frame structure is shown supporting wafer-contacting assemblies in a manner where electrical insulation/barrier means is provided between the respective positive (+) and negative (−) potential assemblies, as well as heat exchanger and a wafer undergoing thermal and electrical test (or wafer level burn-in)

Referring to FIG. 5, an illustration of a system 500 useful for wafer level burn-in in accordance with the present invention is shown. The wafer 100 and optional pliable layer 220 are shown in burn-in position. Control of the upper contact portion 310 shown in FIG. 3 can be achieved through, for example, a manual controller 510. For example, turning a mechanical adjustment mechanism clockwise or counter-clockwise can cause the upper contact portion 310 to be lowered or raised, respectively. Electrical potential at the upper assembly 540 and lower assembly 550 of the system 500 can be achieved through electrical insulators 530 that can be placed between the assemblies 540 and 550. Of course, it should be appreciated by those skilled in the art that electrical insulation can be accomplished at other locations on the system 500. As shown in FIG. 5, the lower assembly 550 can include heat exchanger 520.

Figure 6:
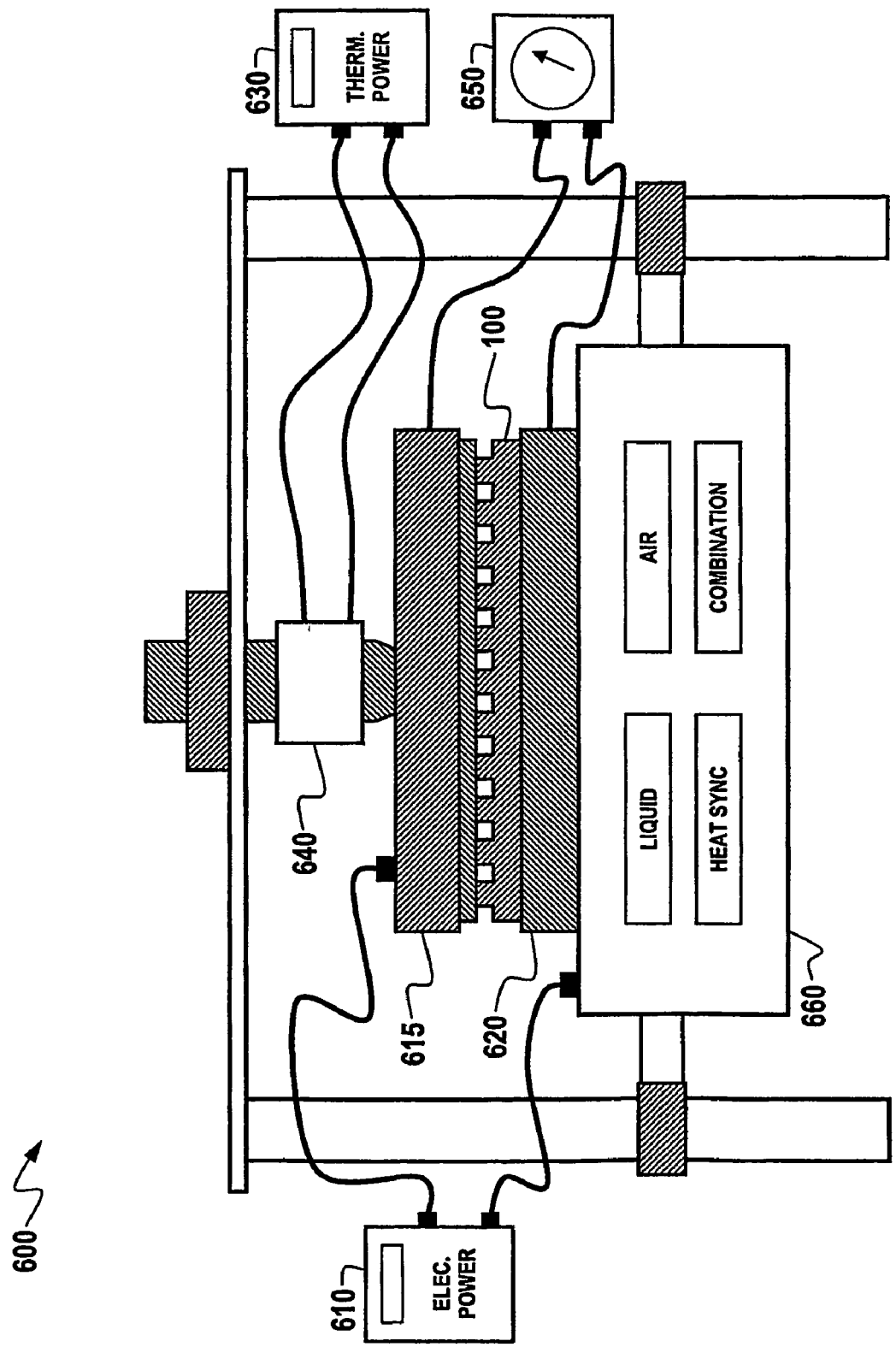
FIG. 6 illustrates another embodiment of the present invention wherein an electrical power source, thermal power source and thermocouple and temperature measuring equipment are in contact with the upper and lower assemblies of the system, as well as optional means of providing temperature control through the heat exchanger.

Referring to FIG. 6, an illustration of a WLBI system 600 in accordance with the present invention is shown with cooperating components to provide electrical power, thermal power, measurements and control features during wafer level burn-in processing. Electrical power can be provided to the upper 615 and lower 620 contact assemblies by an electrical power generator 610. Thermal power can be provided to the upper contact assembly by a thermal coupling 640 that can be placed into contact just above the upper contact plate 615 as shown in FIG. 6. Temperature can be monitored by thermocouple 650. Thermocouple 650 can cooperate with thermal power generator 630 and heat exchanger 660 in order to maintain a constant temperature on the wafer through the cooperation of the thermal coupling 640 and heat exchanger 660. Electrical power can be maintained by an electrical power generator 610 or other electrical equipment known in the art. As shown in FIG. 6, heat exchanger 660 can provide thermal control through liquid, air, heat sink material, or any combination of heat controlling means and equivalents thereof.

Figure 7:
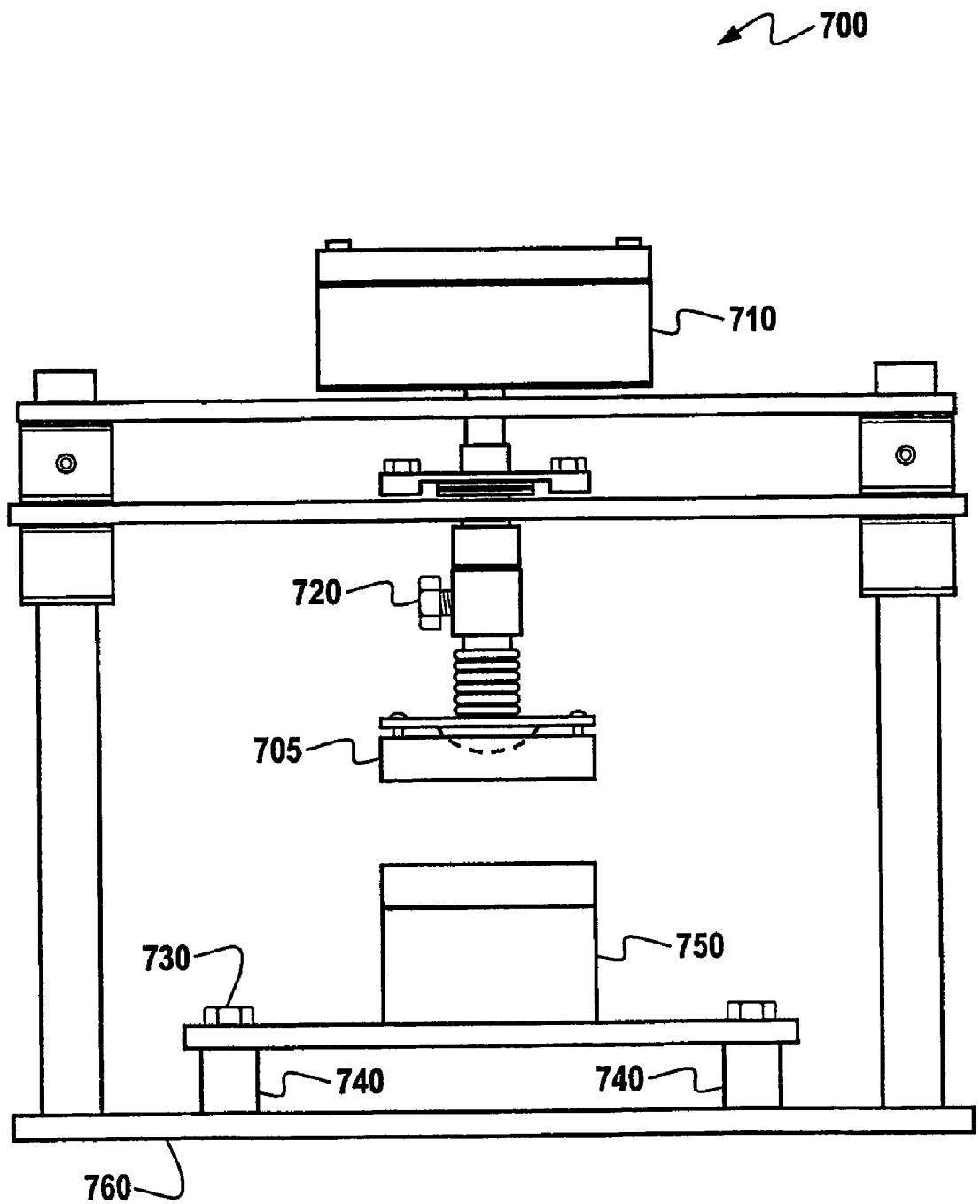
FIG. 7 illustrates another embodiment of the present invention wherein a mechanism for lowering and raising the upper contact plate is shown where the mechanism can be hydraulic, air cylinder, pneumatic, or otherwise controlled.

Referring to FIG. 7, illustrated is another embodiment of the present invention wherein a WLBI system 700 includes a mechanism 710 for lowering and raising the upper contact plate 705. The mechanism 710 can be hydraulic, air cylinder, pneumatic, or otherwise controlled. Also shown in FIG. 7 are electrical contact points 720 and 730 whereon electrical cabling from an electrical generator can be fastened. Another optional location for electrical insulators 740 is shown located beneath the heat exchanger 750 near the base 760 of the system 700.

Figure 8:
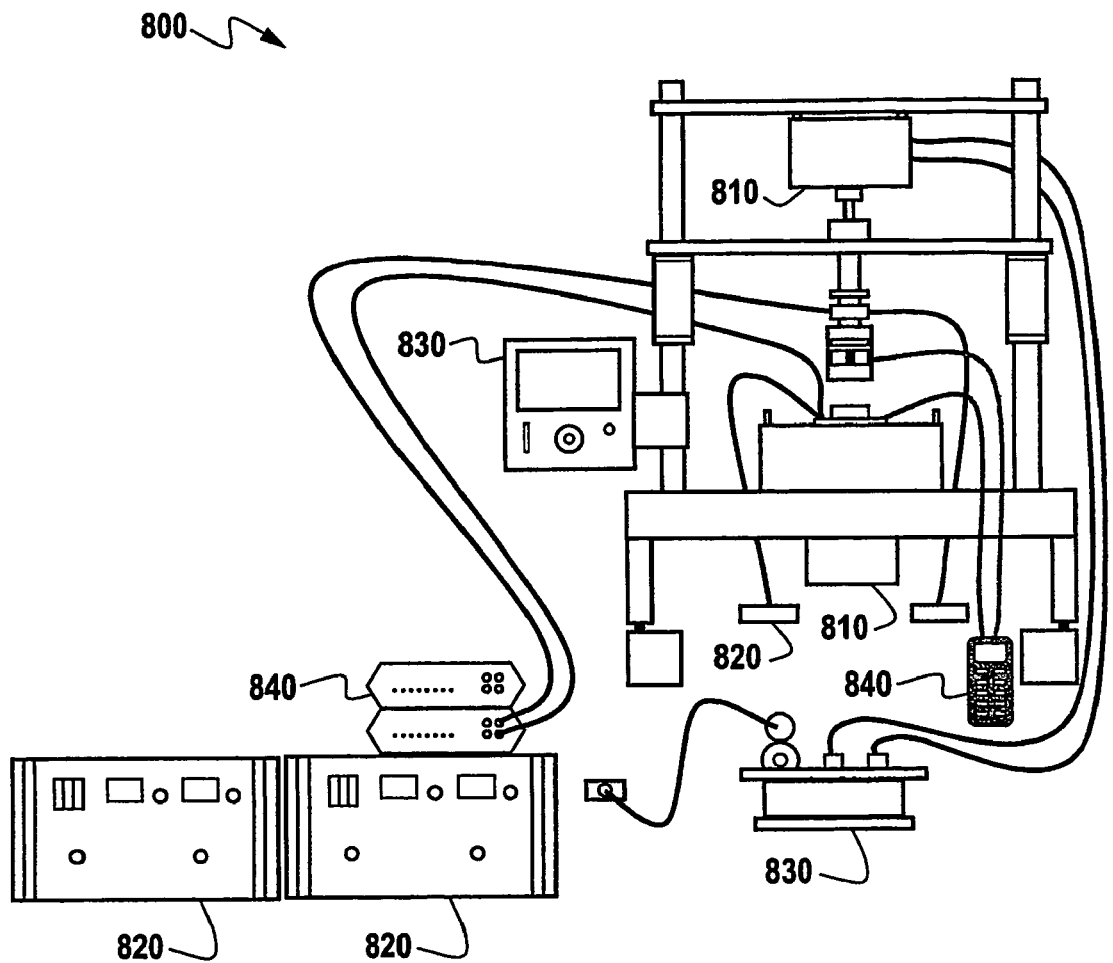
FIG. 8 illustrates mechanical, electrical and measurement components used for the WLBI system in accordance with the present invention.

FIG. 8 illustrates mechanical 810, electrical 820, control 830 and measurement 840 components useful for a WLBI system 800 in accordance with the present invention. The system 800 has been successfully tested in the burn-in of VCSEL wafers.

A method for carrying out WLBI in accordance with the present invention will now be described. It should be understood that variations in steps, time periods, electrical/thermal quantities and other parameters are possible given different semiconductor wafers. Use of a VCSEL in the following example, or exact methods, steps, time periods and electrical/thermal quantities, should not be construed as a limitation to method and systems of the present invention.

Figure 9:
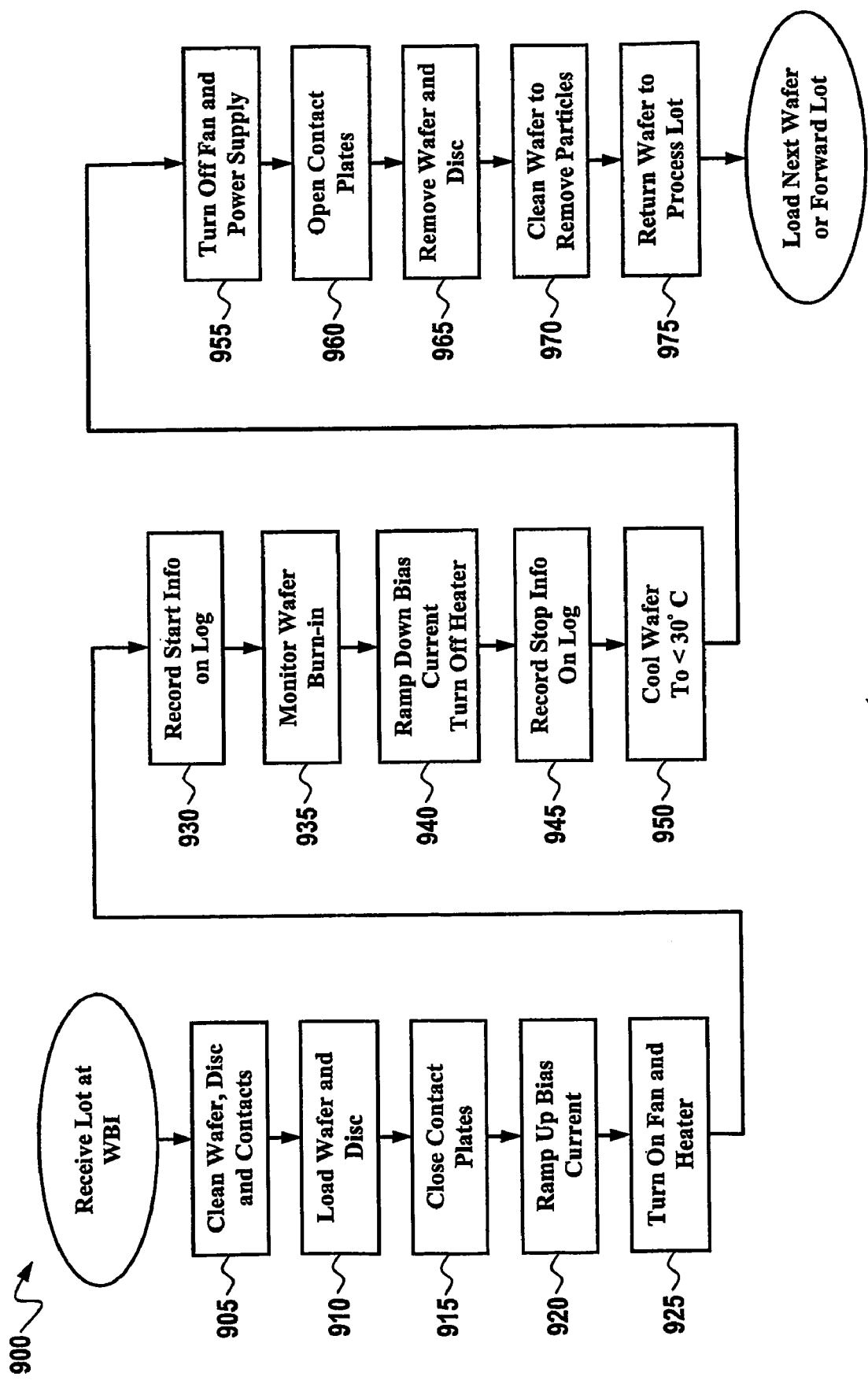
FIG. 9 illustrates a flow diagram of method steps for accomplishing WLBI in accordance with the present invention.

Referring to FIG. 9, a flow diagram is shown illustrating the wafer level burn-in process for a received lot of wafers in accordance with the present invention. Prior to burn-in processing, the wafer, graphite disc, and contact plates should be cleaned at step 905. The wafer number that is typically inscribed on outer top surface edge of the wafer should be checked and recorded prior to loading the VCSEL wafer and graphite disc (pliable layer 220) onto bottom contact plate at step 910. The bottom surface of the wafer should be placed on the lower contact plate so that it faces/contacts the bottom contact plate and the pliable layer 220, if used, can then be placed on the top (device-side) surface of the wafer. The contact plates are then carefully closed at low contact force (to prevent wafer damage) at step 915. The power supply bias current that is electrically in contact with the contact plates is then set to a selected burn-in setting and bias current is ramped up to operational level at step 920. The heat exchanger, for example, a cooling fan, and the thermal source, such as a heater, are then turned on at step 925 to their appropriate burn-in settings.

Once the burn-in process is initiated, a record of burn-in start information and settings may be recorded at step 930 on a burn-in log/form. The wafer burn-in current and temperatures are monitored at step 935 during the burn-in process for each wafer, which may take several hours or days depending on the devices or application.

After the burn-in process time period is completed, the bias current being supplied to the wafer is ramped down and eventually turned off at step 940, and the heater is turned off at step 940. A record of the burn-in stop time and other observable information may be recorded at step 945 on the information log. The wafer is generally allowed to cool down at step 950 to less than 30° C. After the cool-down period, the heat exchanger (cooling apparatus which may include a fan powered by a power supply) is turned off at step 955 (and any other equipment should be turned off for safety and electrostatic discharge reasons). The contact plates are then opened at step 960. The wafer and pliable disc material are then removed at step 965. The wafer is then cleaned at step 970 to remove graphite (or other pliable layer 220) particles, and the wafer is returned to the process lot at step 975. Another VCSEL wafer can then be loaded into the system from the lot or, if the lot is completed, the lot can be forward to the next operation (e.g., verification testing or device assembly).

It should be commonly known that semiconductor wafers must be handled with electrostatic discharge (ESD) considerations in mind. Appropriate cleanliness and non-static equipment, procedures and material should be used at all times when handling semiconductor wafers and devices.

Reference in the above process has been made to "ramp up/down of bias current" and mechanical pressure during closure of contact plates. More detailed information of the present WLBI processing methods will now be provided in light of these important processing considerations.

During initial cleaning of a wafer prior to burn-in, lint-free paper can be placed on the work surface. A lint-free tissue wet with acetone can be used to wipe the conductive graphite disc (pliable layer 220) to remove particles. Both sides of a wafer can be sprayed with an air-dusting product to gently remove loose particles. A lint-free tissue wet with acetone can also be used to wipe the top and bottom contact plates of the burn-in system to remove particles, particularly any remaining graphite or other particles that may remain from previous wafer burn-in. The contact plates and wafer area of the system can also be sprayed with an air dust product.

The lot number and wafer number for a new wafer requiring wafer level burn-in are observed and then recorded on a log sheet. An example of a log sheet is shown in FIG. 10. The wafer number is generally scribed on the top surface edge of the wafer.

The wafer and pliable layer 220 (i.e., conductive disk material), if used, are then loaded into the system as shown in FIG. 2. During loading, the wafer is generally picked up with handling tweezers and placed on the bottom contact plate with the wafer flat facing upward. The pliable layer 220 is then picked up with tweezers and placed on top of the VCSEL wafer with the flat edge of the pliable layer 220 matching the flat edge of the wafer as shown in FIG. 4.

The contact plates are then closed onto the wafer and disk. A system may be equipped with manual or automated contact closing apparatus. Described herein is a process for closing an automated system. In preparing to close the automated contact closing apparatus, the upper contact plate air cylinder air pressure gauge can be set to 10:*5 psi. A "Down" button associated with the contact plate is then initialized to close contact plate. The wafer and/or graphic disk are then monitored during contact plate closure to assure that they do not experience movement/sliding. An operator may be required to open the plate and repeat steps if necessitated by movement.

An operator should wait about one minute after contact plate closure for the system and wafer to stabilize, then pressure, which can be generated by an air cylinder, will be increased while monitoring the air pressure gauge consistent with the following sequence:

20:*5 psi for 1 minute
30:*5 psi for 1 minute
40:*5 psi for 1 minute
50:*5 psi for 1 minute The final operational condition shown during test results for VCSEL was found to be optimal at a 50:*5 psi setting for the air cylinder pressure gauge, which corresponds to 90 psi clamp force across the wafer.

Next in the process can be to ramp up the bias current across the electrical contacts. First, an operator should short the voltage sensor/voltmeter leads together (to protect against supply currents surges during power up). The operator will turn on a 500 Amp power supply. Nominal settings at startup can be an open circuit voltage less than 3.0V and short circuit current to 0 Amps. The power supply should read approximately 0V for voltage output and approximately 0 Amps for current output with the voltage sense leads shorted. The power supply bias current can first be set to 10 Amps. The operator can then remove the voltage sense voltmeter lead short. The supply output voltage should now increase to 1-2 volts. The operator can manually ramp up the bias current slowly (using the current setting knob typically found in electrical power supply equipment) with the following schedule:

For 120 Amp wafers:
10 Amps for 2 minute (after sense leads short removal)
20 Amps for 3 minutes
40 Amps for 4 minutes
80 Amps for 5 minutes
120 Amps for final burn-in setting.

For 170 Amp wafers:
10 Amps for 1 minutes (after sense leads short removal)
20 Amps for 2 minutes
40 Amps for 2 minutes
80 Amps for 3 minutes
120 Amps for 3 minutes
170 Amps for final burn-in setting.

For 480 Amp wafers:
20 Amps for 1 minute (after sense leads short removal)
40 Amps for 2 minutes
80 Amps for 3 minutes
160 Amps for 4 minutes
240 Amps for 5 minutes
320 Amps for 5 minutes
360 Amps for 5 minutes
400 Amps for 5 minutes
440 Amps for 5 minutes
480 Amps for final burn-in setting.

It is important to ramp the bias current slowly to avoid excessive temperature transients, which can shock and break the wafer. These current ramp rates will limit thermal transients to less than 5° C./minute. Refer to Table 1 for the burn-in current generally used for different wafer types.

TABLE 1

| Device Category | Device Type | Device Bias Current ($I_F$) | Wafer Substrate Temperature ($T_A$) | # Devices per Wafer | Wafer Burn-in Current (A) | Burn-In Time (hours) |
|---|---|---|---|---|---|---|
| SEC1038 | Proton Array | 20 mA | 125 ± 5° C. | 8000 | 170 ± 10 | 20 (+4, −0) hours |
| SEC1046 | Oxide Array | 20 mA | 125 ± 5° C. | 8000 | 170 ± 10 | 20 (+4, −0) hours |
| SEC2013 | Proton Discrete | 20 mA | 125 ± 5° C. | 24000 | 480 ± 10 | 20 (+4, −0) hours |
| SEC2034 | Single Mode Oxide | 5 mA | 85 ± 5° C. | 24000 | 120 ± 10 | 20 (+4, −0) hours |
| SEC2036 | Oxide Array | 20 mA | 125 ± 5° C. | 8000 | 170 ± 10 | 20 (+4, −0) hours |

Next, the operator should check the wafer substrate temperature on thermocouple readout. Wafer temperature used for a VCSEL wafer, for example, should be increased steadily from 25° C. toward the 125° C. burn-in temperature. The heat exchanger should then be activated. If the heat exchanger is a heat sink in combination with a cooling fan, then the cooling fan power switch should be powered on (if not already operational) and the temperature of thermal monitoring should be set to control the cooling fan in accordance with device specification such as shown in Table 1 (e.g., either 85° C. or 125° C.). A fan with an automatic operation can now cycle on/off to cool the wafer when the substrate temperature exceeds the set control temperature.

The wafer/wafer substrate temperature can be checked using a thermocouple readout. The wafer's temperature may increase steadily toward the specified burn-in temperature at a less than 5° C./minute rate. For 120 Amp and 170 Amp wafer types, the operator should turn on the top plate heater power when the wafer substrate temperature exceeds 50° C. 480 Amp wafer types do not generally require top plate heat to reach burn-in temperature. The wafer burn-in for a VCSEL wafer can be considered "started" when the wafer substrate temperature reaches 100° C. for 125° C. burn-in condition wafer types and 60° C. for 85° C. burn-in condition wafer types. A record of the start time and other information can be recorded in proper spaces of the burn-in log shown in FIG. 10.

The operator should monitor the wafer carefully during burn-in startup until wafer substrate temperature stabilizes at specified burn-in temperature (e.g., 85 or 125:t5° C. for VCSEL) and check the wafer substrate temperature periodically during the entire burn-in (e.g., 20 hours for VCSEL wafers). The cooling fan should cycle on/off with temperature ranging:t5° C. The 120 and 170 Amp wafers will seldom cycle on the fan. The 480 Amp wafers will cycle the fan on/off in approximately 2 minute intervals. Power supply current should also be monitored periodically during the burn-in to verify the nominal bias current is maintained. Clamp (contact) pressure should also be checked periodically to verify the appropriate setting (e.g., VCSEL at 50:*5 psi) is also maintained in order to ensure that adequate thermal and electrical contact is being maintained on the wafer. The top contact plate heater can also be periodically monitored to verify the appropriate temperature reading is maintained. If wafer substrate temperature exceeds the maximum allowable (e.g., 135° C. for VCSEL), immediate corrective action should be taken by setting the cooling fan to the "ON" position or, if required, decrease/turn off power supply bias current.

At completion of the burn-in period, the current will be ramped down and the heater turned off. For VCSELS, the operator will carefully ramp down the power supply bias current (to avoid temperature transients that can shock and break the wafer) and turn off top plate heater as follows:

120 Amp wafers:
120 Amps is the burn-in setting with top plate heater ON.
Turn off the top plate heater
80 Amps for 3 minutes
40 Amps for 3 minutes
20 Amps for 3 minutes
10 Amps for 3 minutes
0 Amps to complete bias shutdown.
170 Amp wafers:
170 Amps is the burn-in setting with top plate heater ON.
Turn off the top plate heater
120 Amps for 3 minutes
80 Amps for 3 minutes
40 Amps for 3 minutes
20 Amps for 3 minutes
10 Amps for 3 minutes
0 Amps to complete bias shutdown.
480 Amp wafers:
480 Amps is the burn-in setting with top plate heater OFF.
400 Amps for 3 minutes
360 Amps for 3 minutes
320 Amps for 3 minutes
240 Amps for 3 minutes
160 Amps for 3 minutes
80 Amps for 3 minutes
40 Amps for 3 minutes
20 Amps for 3 minutes
10 Amps for 3 minutes
0 Amps to complete bias shutdown
Short the voltage sense leads together upon bias shutdown.

This procedure should prevent the power supply from swinging to −1.0 volts across the wafer and contact plates. The power supply should then be turned off. The stop time and date are then recorded on the burn-in log. The stop time can be the time the operator began the burn-in current ramp-down cycle. The wafer is then allowed to cool down to <80° C. substrate temperature with clamp force applied, no bias current, and with cooling fan set at the burn-in setting. For 120 Amp wafers, cool the wafer to <70° C. with cooling fan set at burn-in setting. Typically this cooling period will take less than 20 minutes. When the substrate temperature drops to <80° C. (or <70° C. for 120 Amp wafers), the cooling fan can be turned to the "ON" position. The fan will run continuously at full speed. This will accelerate the cooling rate (but with wafer thermal transient <50° C./minute). When the wafer substrate temperature drops below 30° C., the cooling fan can be turned on to the "Auto" position. Typically the cooling period with fan fully on should take less than 20 minutes.

To open up the contact plate, the contact plate clamp air pressure gauge setting should be reduced from 50 psi to 10 psi with the following sequence:
50:*5 psi burn-in setting
40:*5 psi for 1 minute
30:*5 psi for 1 minute
20:*5 psi for 1 minute
10:*5 psi for 1 minute To open the contacts, the operator will activate the contact "UP" switch. The top contact plate should open slowly. The operator should watch the wafer and disc for sticking or sliding motion during the opening process. If necessary, the operator may have to prevent the wafer from sliding off the bottom plate by retaining it with tweezers. When the top contact plate stops moving upward, the wafer and disc are ready for removal. The wafer and disc should be adhered together on the bottom plate. After removal from the lower contact plate, the wafer should be examined (after separating the pliable layer 220, if used on either side of the wafer, from the wafer) for any breakage or other visual damage. The procedure is generally completed once all information on the wafer and observation are recorded on the burn-in procedure log.

The contact method described herein is for electronic devices with front and back contacts. This includes, for example, VCSEL type lasers, other lasers, LEDs, semiconductor diodes, plus other types of electronic devices. The contact method preferably comprises two distinct electrodes, one on each side of the wafer for application of bias. Use of a pliable layer 220 can enable contact over the full wafer surface and all devices across it.

The pliable layer 220 described herein as pliable and/or graphite material formed as a disk to correspond to the size and shape of the wafer may be added to one, both, or neither side of wafer, between the electrode (contact plate) and the wafer. As described in some detail with regard to the illustration of FIG. 4 above, the intermediate contact layer 220 is electrically conductive, thermally conductive, and mechanically compressible.

The present WLBI system can include equipment apparatus and design currently available in the electronic, electrical, mechanical, measurement and control arts. These include, but are not limited to:

Two or more electrodes that contact the full surface area of the two wafer sides to apply bias and mechanical contact.

Two or more highly electrically and thermally conductive electrodes that provide uniform bias and temperature across the wafer.

A mechanically compressible electrode to apply and remove controlled and measured mechanical force for contact.

A temperature controlling heat exchanger structure that simulates heat flow in a component package application with heat path through wafer substrate contact and injection/removal of heat from each electrode as required to duplicate the component package application.

A temperature controlling heat exchanger structure that can remove heat from one electronic device wafer side by air or liquid cooling.

A temperature controlling heat exchanger structure that can remove or inject heat from either or both electronic device wafer sides by air or liquid cooling.

A temperature control system that inserts a thermocouple into the electrodes on each side of the electronic device wafer to measure the electrode plate temperature and utilizes that signal to control heat injection/removal to/from the electronic device wafer.

A modular, two-section, self-leveling, electrode contact plate that makes initial low force contact to the full wafer surface and seats level to the electronic device wafer surface, then a second contact plate that makes high force contact in the center of the first contact plate. The pivot interface self corrects for non-planarity of the contact plates and electronic device wafer.

A modular, two-section, self-leveling, electrode contact plate that has a spherical surface contact (or other similar geometrical surface) between the two sections, for large contact area and low contact resistance versus a flat surface contact. A heat exchanger structure that removes heat from an electrode by guiding the heat into a large area with fins, directing high velocity air flow onto the center fin areas, then channeling it out the fins to an exit surface where the heated air is removed.

A removable pedestal electrode contact area that enables periodic electrode replacement without replacement of the entire electrode/heat exchanger item.

A surface plating on the electrodes, such as gold and/or nickel plating, to prevent metallic migration into the electronic device wafer, to prevent electrode oxidation, and to provide low resistance contact to wafer and/or intermediate contact material.

A heat exchanger structure that maintains a contact electrode at a constant temperature through a heat guide from the contact electrode to a constant temperature surface, such as, but not limited to, a heat guide from the contact electrode into a vessel of boiling water at 100° C. For a given heat flow from an electronic device wafer and given heat guide dimensions, a constant delta temperature can be maintained relative to the constant temperature surface.

A heat exchanger structure that removes heat from the electrode by the heat of evaporation of liquids, including but not limited to boiling water, with replenishment of the liquid by an automatic liquid level monitor.

A heat exchanger structure that adjusts the contact electrode temperature by adjusting the heat guide dimensions to adjust the thermal resistance. This adjustment includes, but is not limited to, adjustable screw insertions to threaded holes in the heat guide which vary the heat guide cross-sectional area and effective thermal resistance.

An electrical bias connection between the contact electrodes and the bias supply which provides electrical contact with sufficient electrical and thermal properties to avoid excessive heat generation from electrical loss but prevents bias supply damage by heat flow from the electrodes into the bias supply. This connection includes, but is not limited to, metal BUS bars or cables for low electrical resistance, with air or liquid cooling of the bars/cables to remove heat that flows down the bars/cables.

And/or any combination of the above items.

The following description will now focus on VCSEL wafer burn-in considerations, but the principles can apply to other semiconductor wafers. The VCSEL wafer product is generally a 3-inch diameter round (with 2.9 inch diameter flat) gallium arsenide (GaAs) semiconductor wafer, typically 0.008-0.014 inches thick. The wafer has been processed with metallization patterns on the top side and full surface metallization on the bottom side. The wafer level burn-in process is a powered burn-in, supplying 20 mA dc typically, with 5-20 mA dc for some products, current limited, with approximately 2 volts to each device on the wafer, at 125° C. typically, with 85-150° C. for some products, controlled +/−5 C, for 20 hours typically in an air ambient atmosphere. Each wafer (depending on device type) will have 24K-58K devices, for a total burn-in power supply current requirement of 120-1,200 Amps, with supply voltage capable of ranging 0-5 volts.

Typical VCSEL wafer power dissipation will range from 200 watts to 2,000 watts, depending on device count/wafer and bias current/device. The burn-in system of the present invention provides metal electrodes, which clamp at controlled pressure (adjustable 10-100 psi force, controllable to +/−5 psi) to the two sides of the wafer, opening up for loading/unloading. A graphite foil (i.e., pliable layer 220) nearly matching the shape of the VCSEL wafer surface, and currently known to be about 0.015 inches thick, can be inserted on the patterned topside of the VCSEL wafer to provide a cushioning layer that is electrically and thermally conductive. Significant heat will be generated by the combination of the graphite foil and the wafer during burn-in, which must be thermally managed by the burn-in system to maintain the targeted wafer bottom side temperature. Air and/or liquid cooling are useful to manage the thermal load.

The present inventors have developed a wafer level burn-in system which is air cooled and maintains 125° C. wafer temperature for up to 1,200 watts, with control for up to 1,400 watts at 140° C. wafer temperature. The target performance for maximum power dissipation is to maintain a 125° C. wafer temperature at 1,600 watts power dissipation. The WLBI system utilizes an air cylinder clamp to apply up to 700 pounds of force on the wafer. A thermocouple provides wafer substrate temperature to a control box, which turns the cooling fan on/off to maintain the target temperature +/−5° C. in the center of the bottom contact plate. The temperature profile across the bottom copper plate drops approximately 10° C. at edge from center reading. The heat path is generally downward through the bottom copper contact plate into a large copper heat sink with cooling fins through which air is forced. A propeller fan with 600 cfm capacity is utilized. An auxiliary heater is connected to the top contact plate to inject heat for low current wafer products.

The system used to accomplish VCSEL wafer burn-in should uniformly apply a pressure contact to the wafer that is adjustable to a target of 10-100 psi on 3 inch diameter wafer. This corresponds to 70-700 total pounds clamp force on 3 inch diameter wafer. The pressure should be controlled to +/−5 psi. An adjustable 120-1,200 Amps of dc current at 0-5 volt range during 20 hour burn-in is applied to the wafer and the devices formed on the wafer. Control of the voltage should be to within +/−1%.

Up to 2,000 watts of heat should be dissipated to control wafer temperature to a target in 85-150° C. range to +/−5° C. temperature tolerance over, for example, a 3 inch diameter wafer during the 20 hour burn-in. The contact pressure, bias current/voltage, and wafer temperature heating/cooling should be ramped up/down during burn-in startup/completion in a controlled and adjustable manner. Contact pressure, bias current, bias voltage across wafer contact plates, and wafer (bottom contact plate) temperature during burn-in and the ramp-up and ramp-down should be monitored and data logged.

Material types selected for the machine parts of the WLBI system can include aluminum and copper as well as other material types. Support machined parts are preferably aluminum and all high-current path material is preferably copper with gold/nickel plated contacts to block copper migration into the gallium arsenide VCSEL wafer and to prevent copper oxidation and parasitic resistance/heat generation.

The top/bottom contact plates (210 and 215) should preferably self level to approximately 0.003 inches. The graphite disk (pliable layer 220) can compress to about 0.003 inches to compensate for some wafer/plate parallelism variations. The system should be able to operate continuously during a 20 hour burn-in for VCSELs. The system's use can be assumed to be over a six-day per week operation with four hours load/unload time.

VCSEL wafers should preferably be burned-in with controlled pressure contact, controlled bias current, and controlled temperature, for a controlled time period, without wafer breakage. Ramp-up and ramp-down processes should be controllable. The contact plate areas should preferably be flat, smooth, and clean to prevent irregular surfaces that can cause wafer breakage. A PC-based logging system with sensor instruments can be used to automate monitoring and to supply periodic readings. A PC-based system can monitor contact pressure, bias current, contact plate bias voltage, bottom contact plate temperature, top contact plate temperature, and log data each minute during ramp-up and ramp-down, then every 5 minutes during the 20 hour burn-in period. A data log for each system/wafer burn-in lot can be supplied in a data file that can be uploaded to a network server location.

For monitoring, a power supply can be calibrated and can supply signal on bias current. A voltmeter can measure contact plate bias voltage. Thermocouples can be inserted into upper/lower contact plates to measure temperature.

An over-temperature alarm should trigger shutdown of the bias power supply, which will remove the heat generation source. If loss of system air pressure should occur, the wafer contact force will be lost, which should trigger a system alarm. An uninterruptible power supply (UPS) should be used to support auxiliary 110 VAC control electronics to protect the system in case of loss of 110 VAC power. If loss of three-phase power should occur, a system alarm should trigger so that remedial measures can be taken to save the wafer and system.

Software used within a PC-controlled and automated data logging system can control and monitor several WLBI systems simultaneously; preferably, data log file output that can be uploaded to a network server location and viewed with Microsoft® compatible software (e.g., Excel, etc). A network interface such as Ethernet can provide the necessary network linkage and instrumentation control remotely.

Each WLBI system should preferably use three-phase 208V AC 20 Amps for the power supply and single phase 110 VAC 20 Amps for control box electronics.

The system should provide electrostatic discharge (ESD) protection connections for operators during wafer handling. Wafer contact plates will be connected electrically to power supply terminals to prevent ESD.

The present burn-in process has already been shown in tests to "stabilize" VCSEL performance by operating a wafer-based device at elevated temperature and dc current for a fixed time. Component burn-in has been successfully tested at a temperature of 125° C., current of 20 mA, and a duration of 20 hours. The wafer-based test components were verified to be "stabilized" after individual components were built after being removed from the burned-in wafer, and changes in optical power output for each device was tracked during a 14 hour "operational" burn-in.

During testing, the WLBI system was required to work with "die shrink" wafers which would have 50K die/wafer, drawing 1,000 Amps/wafer at 20 mA/die, at 1.6V forward voltage drop for 1,600 watts total power dissipation. This wafer VF×IF power dissipation was to be the heat generator to drive the wafer to 125° C. The system then had to remove the heat in a controlled manner to maintain 125° C. The present invention has been shown to be operational at a full 1,000 Amps capability, with up to 2,100 watts dissipation capability. Testing of WLBI on full wafers to verify proper delta PO (optical power output) stabilization determined several interesting effects. Proton and oxide VCSELs behaved differently, leading to increased understanding of the manner in which the current flowed through the wafers. WLBI was demonstrated to roughly approximate the stabilization achieved by the component burn-in process. With the teaching of the present invention, WLBI is achievable for an 870 Amp array VCSEL product and can be adapted for use with other semiconductor products (e.g., LEDs) having electrical contact points at front, back or other surfaces of the wafer.

Several heat exchanger designs can be utilized to provide for thermal management of wafers being burned-in with the present invention. These diverse thermal management options will now be discussed.

Figure 11:
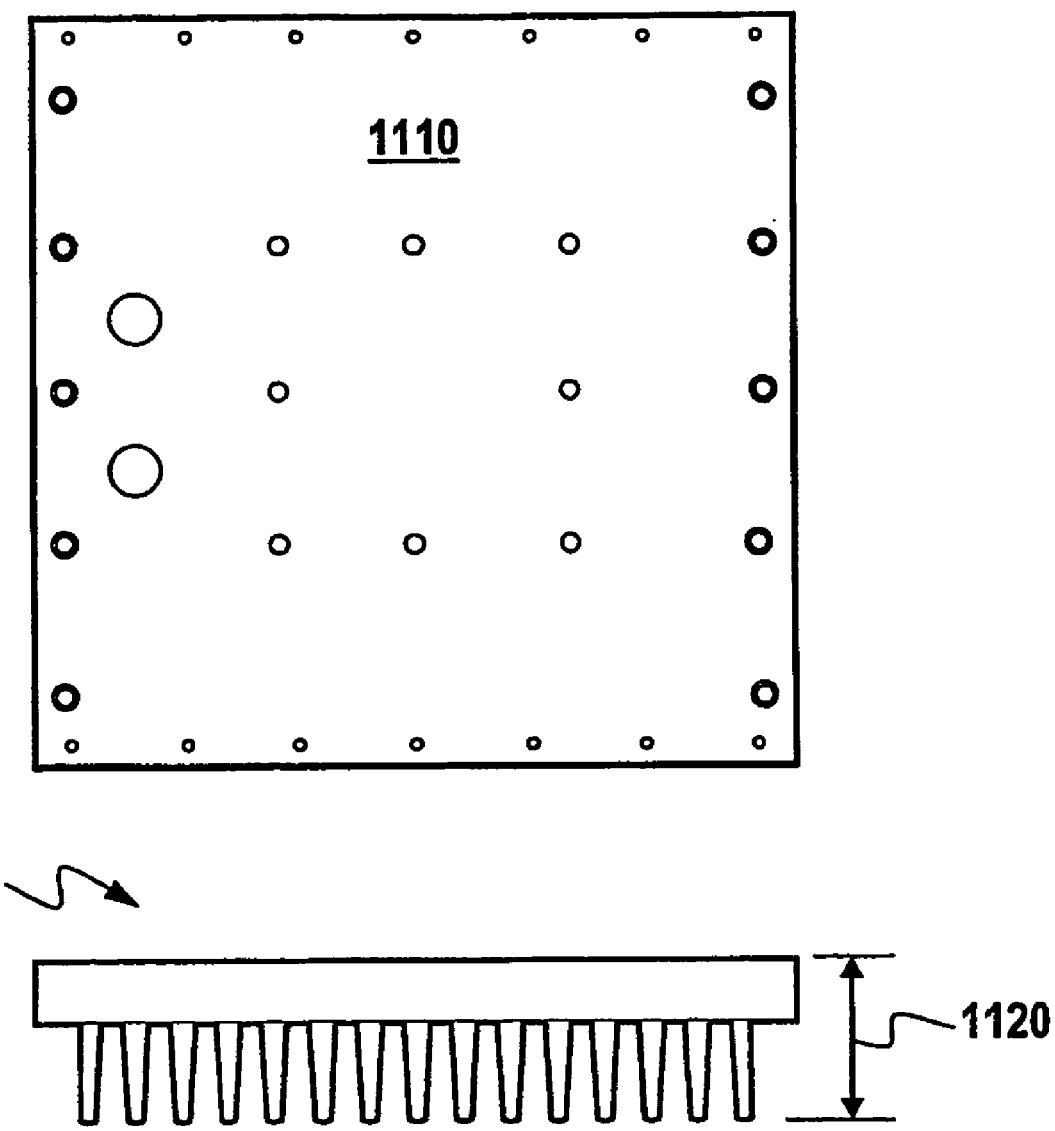
FIG. 11 illustrates top and side views of a heat sink that can be utilized as the heat exchanger for assisting in cooling the lower contact plate and ultimately, any wafer undergoing testing.

FIG. 11 illustrates top and side views of a heat sink that can be utilized as the heat exchanger 225 for assisting in cooling the lower contact plate 215 and ultimately the wafer 100 undergoing test. Referring to FIG. 11, a top 1110 and side 1120 view of a heat sink 900 usable to draw heat from the lower contact plate 215 of the system is shown. The heat sink 900 would be placed in position as the heat exchanger shown in most of the figures, in particular FIGS. 2 (reference numeral 225), 3, and 5 (reference numeral 520). The heat sink can be made of copper and utilize mounting holes to mechanically secure it to the contact plate and system frame. The heat sink is formed so that a radiator portion provides adequate surface area and ventilation for it to cool and ultimately cool the contact plate. A fan (not shown) can be placed underneath the heat sink directed at the radiator portion to facilitate cooling. Liquid (not shown) can also be allowed to circulate through the radiator portion to assist in cooling.

Figure 12:
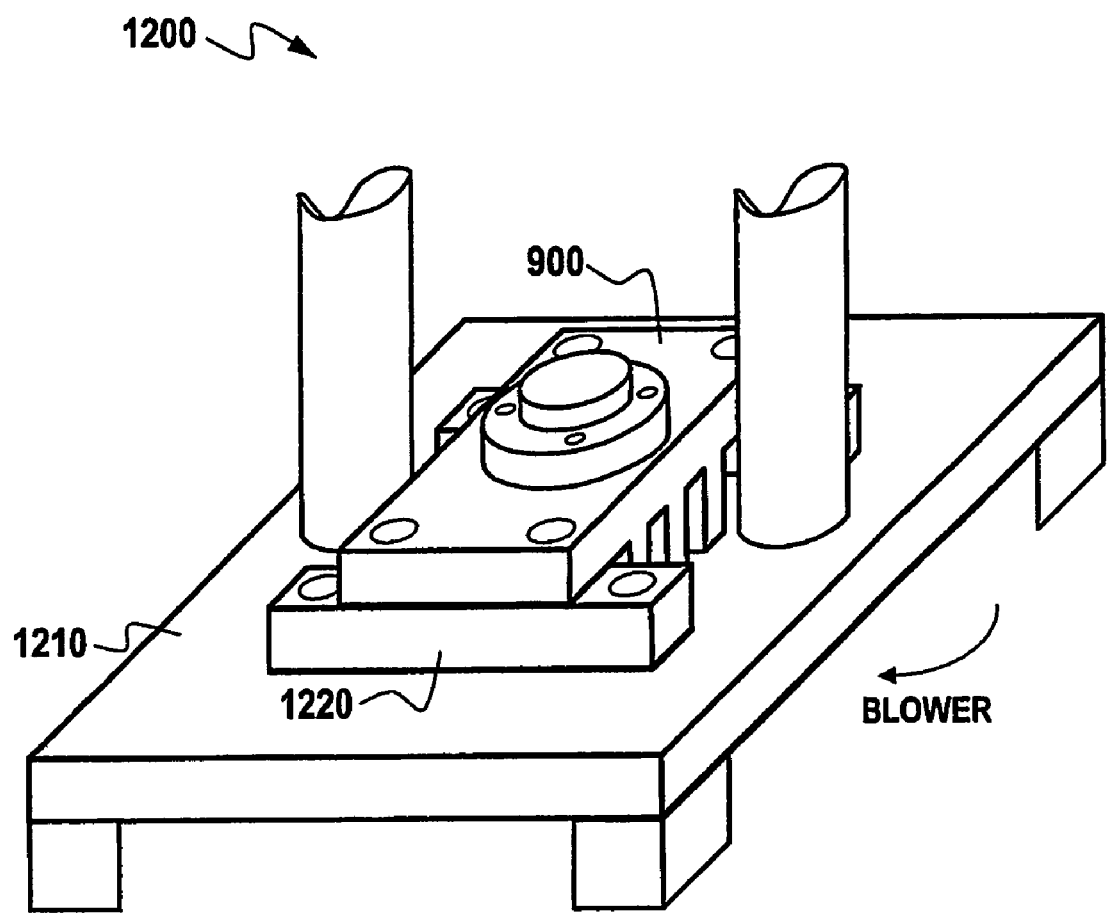
FIG. 12 illustrates a perspective view of the lower assembly of a WLBI system in accordance with the present invention wherein the heat sink is mounted to an aluminum base using electrically insulated fiberglass mounts.

FIG. 12 illustrates a perspective view of the lower assembly 1200 of a WLBI system in accordance with the present Invention wherein the heat sink 900 is mounted to an aluminum base 1210 using electrically insulated fiberglass mounts 1220. Those skilled in the art will recognize that other materials can be used as well.

Figure 13:
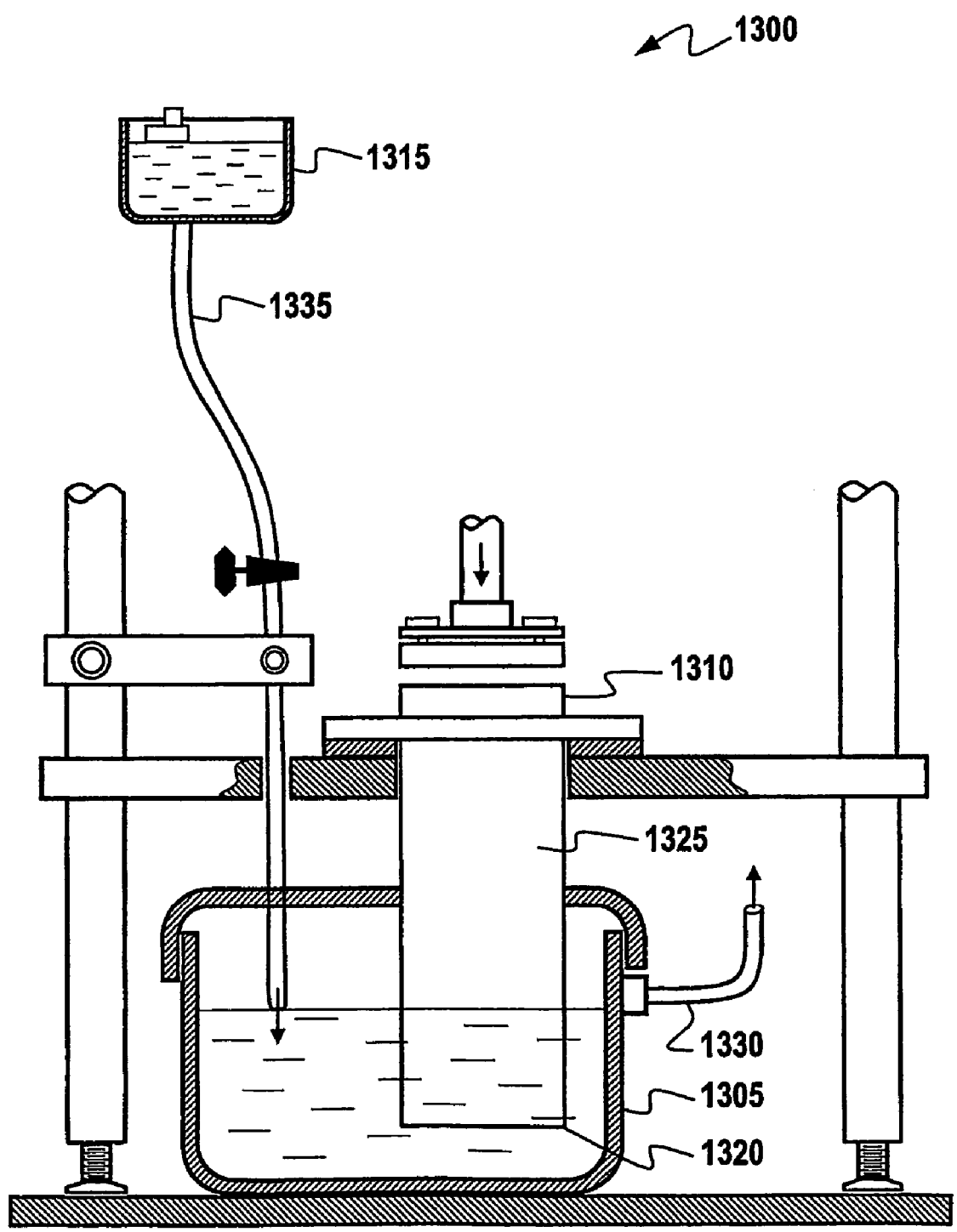
FIG. 13 illustrates a side view of another embodiment of the present invention wherein liquid can be used to cool the lower contact portion of the system.

FIG. 13 illustrates a side view of another embodiment of the present invention wherein liquid can be used to cool the lower contact portion of the system. Referring to FIG. 13, a WLBI system 1300 is generally shown with a liquid cooled heat exchanger 1305 for cooling the copper chuck 1310. With the illustrated system 1300, water (or other coolant) is supplied remotely from a water source 1315 to the liquid coolant container 1305. The copper chuck 1310 is in thermal communication with the coolant via elongated copper heat conductor 1325. Coolant is allowed to evaporate through port 1330 during cooling operation. As more coolant is required to cool the copper chuck 1310, new coolant is added to the container 1305 via liquid line 1335.

Using copper heat conductor 1325 as the heat conductor with, for example, a 3.17 inch diameter, the boiling water level will need to be 2.0 inches below the surface of the chuck 1310 for a heat load of 1,000 W; for 2,000 W the boiling water level will need to be 1.0 inch below the surface of the chuck 1310. Lower thermal conductivity materials can be used if the boiling water surface is much closer to the top of the chuck 1310.

The copper heat conductor 1325 must extend into the boiling water at all times. A heat conductor/chuck cylinder that is about 8.04 cm (3.17 inches) diameter and about 10 cm (4.0 inches) high may be optimum. The heat conductor 1325 and chuck face can both be 8.04 cm (3.17 inches) in diameter.

Figure 14:
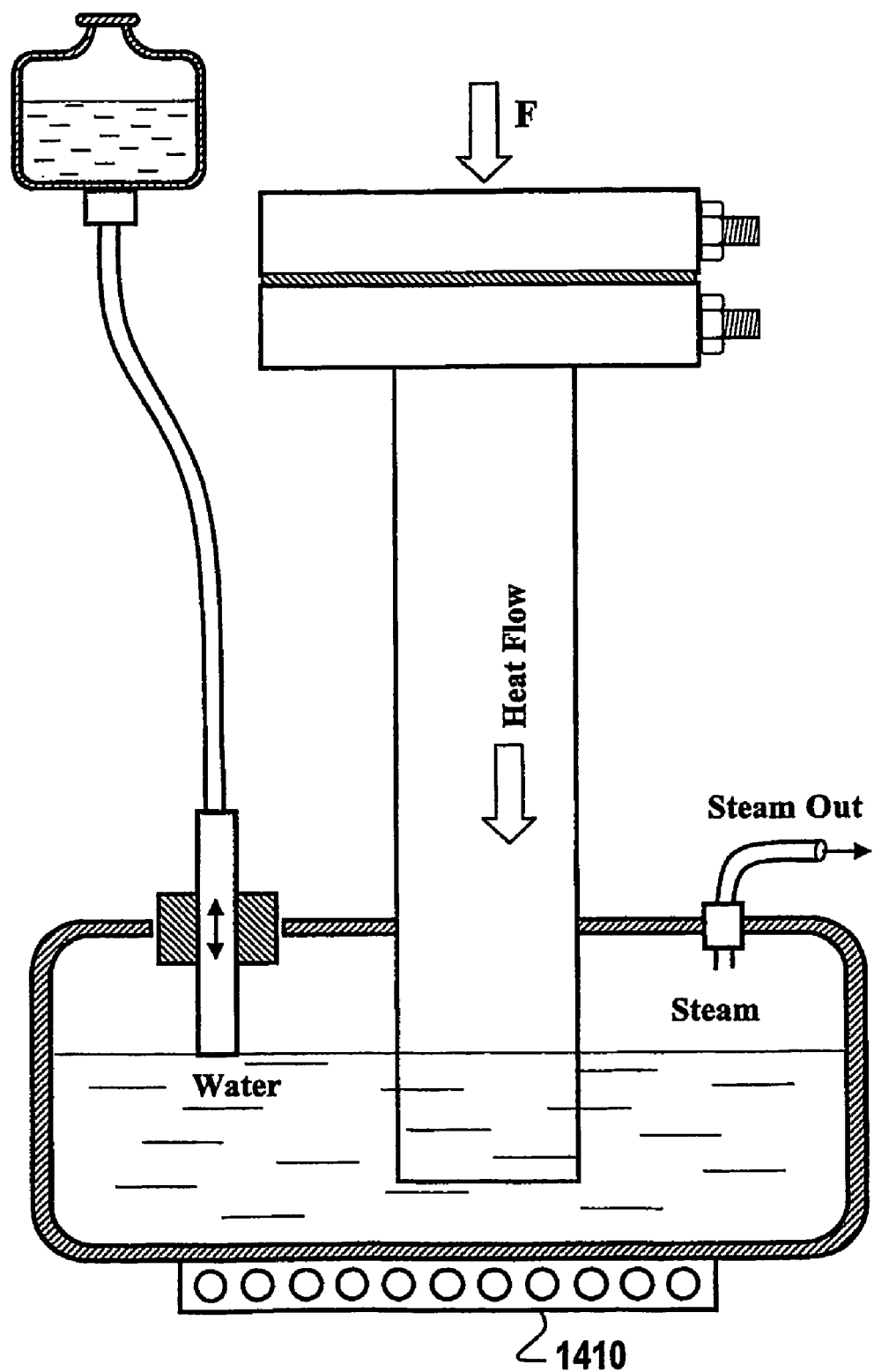
FIG. 14 illustrates another side view perspective of a liquid-cooled system wherein a preheating element can be used to control liquid temperature.

FIG. 14 illustrates another side view perspective of a liquid cooled system similar to the system described in FIG. 13, wherein with the system shown in FIG. 14 a preheating element 1410 can be used to control liquid temperature.

Figure 15:
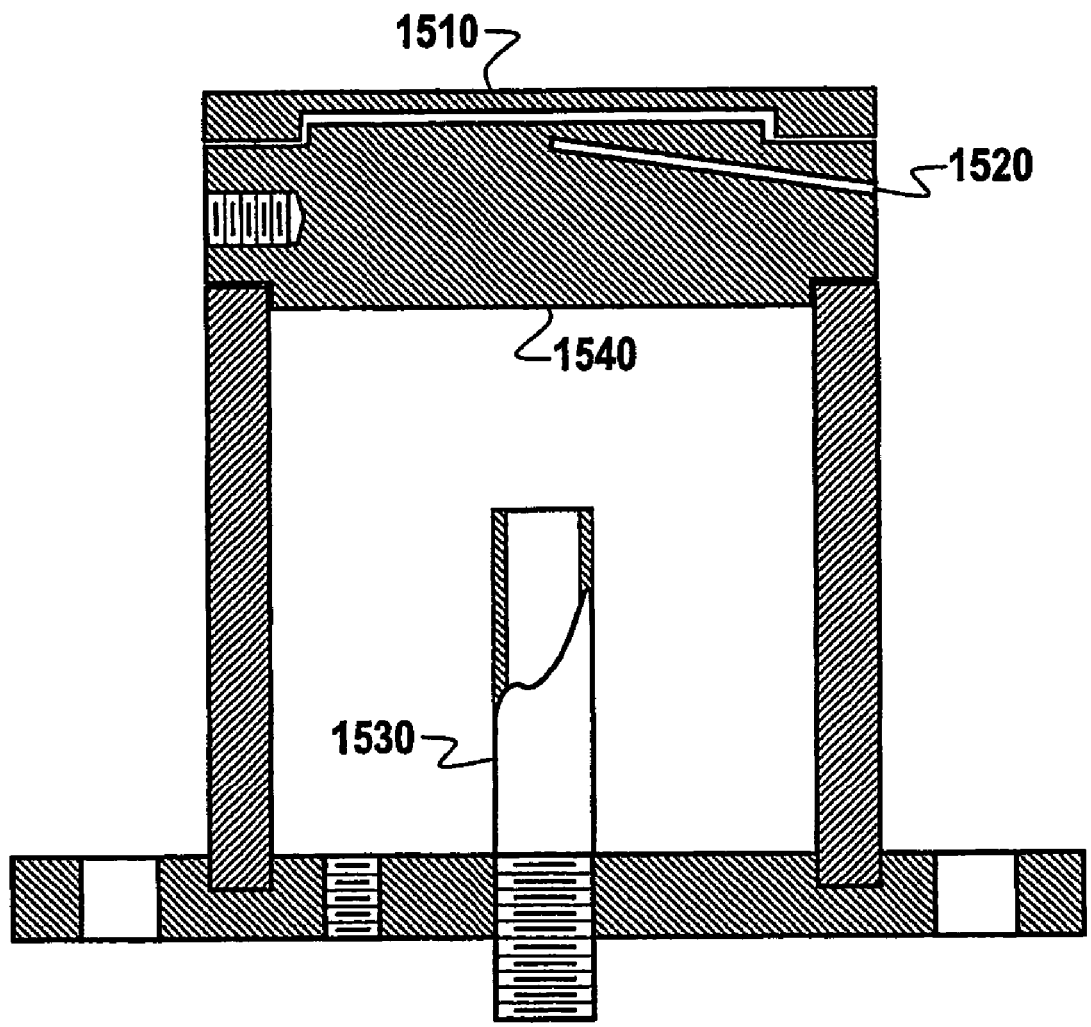
FIG. 15 illustrates a side view of another embodiment of the present invention wherein the bottom contact plate has a hole formed into it to allow a thermal sensor to take accurate measurements of plate temperature near the center of the contact plate nearest the center of a wafer being supported by the lower contact plate, and also a new configuration for providing liquid coolant through a copper tube directly onto the bottom of the lower contact plate.

FIG. 15 illustrates a side view of another embodiment of the present invention wherein a bottom contact plate assembly 1510 has a hole 1520 or other access formed into it to allow a thermal sensor to take accurate measurements of plate temperature near the center of the contact plate 1510 nearest the center of a wafer being supported by the lower contact plate 1510. FIG. 15 also illustrates a mechanism for providing liquid coolant through a copper tube 1530 or other input port directly onto the bottom 1540 of the lower contact plate 1510.

Figure 16:
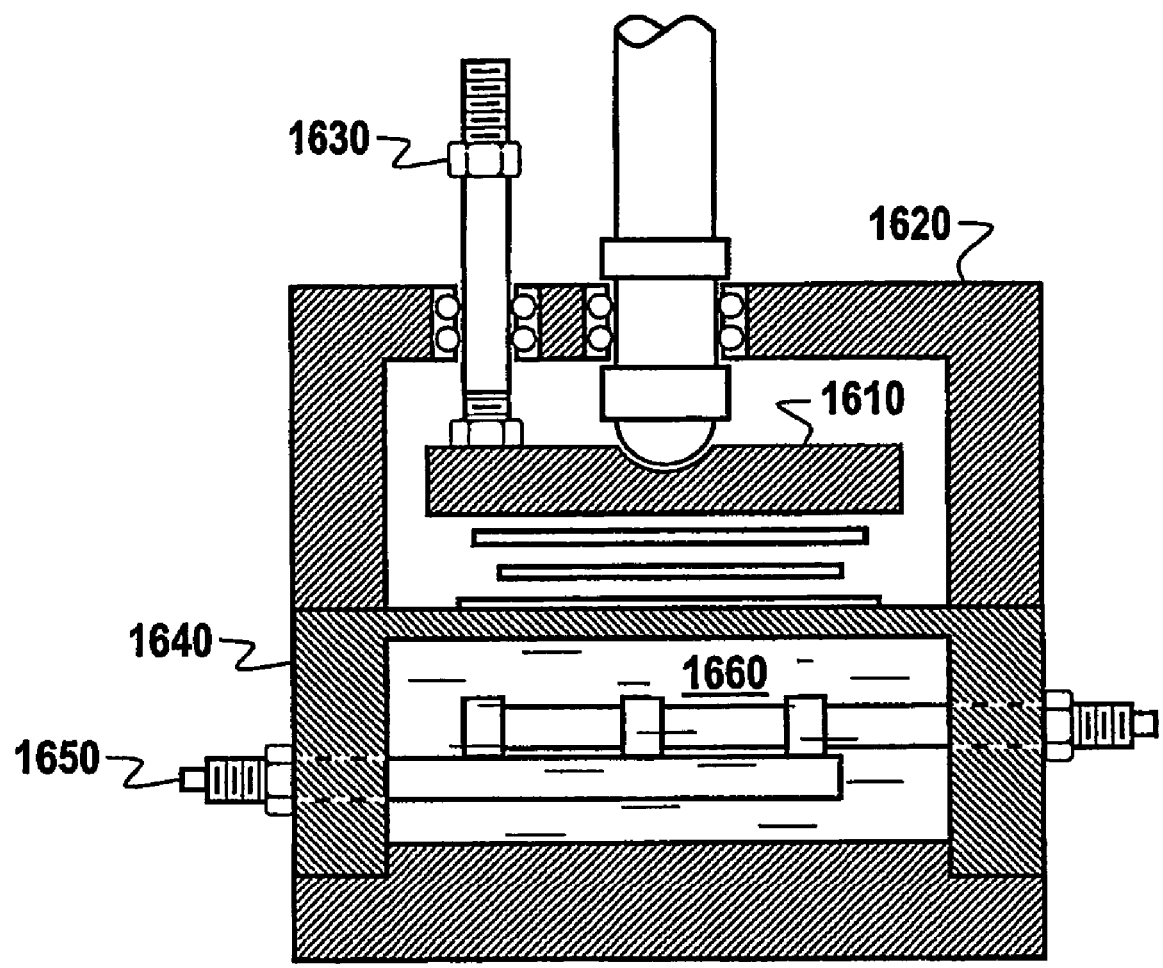
FIG. 16 illustrates a side view of another embodiment of the present invention wherein the upper contact plate is contained within a housing, upper plate level adjustment mechanism provides for leveling of the upper contact plate and lower contact plate is closely integrated as part of the heat exchange unit wherein liquid coolant is allowed to spray over the lower surface of the contact plate/heat exchanger.

FIG. 16 illustrates a side view of another embodiment of the present invention wherein the upper contact plate 1610 is contained within a housing 1620. An upper plate level adjustment mechanism 1630 provides for leveling of the upper contact plate 1610. The lower contact plate is no longer shown as a separate unit and instead, is shown integrated as part of the heat exchange unit 1640. During operation, liquid coolant supplied to the heat exchange unit 1640 is provided through input port 1650 and is allowed to spray over the lower surface of the contact plate/heat exchanger 1660 as shown in FIG. 16.

Figure 17:
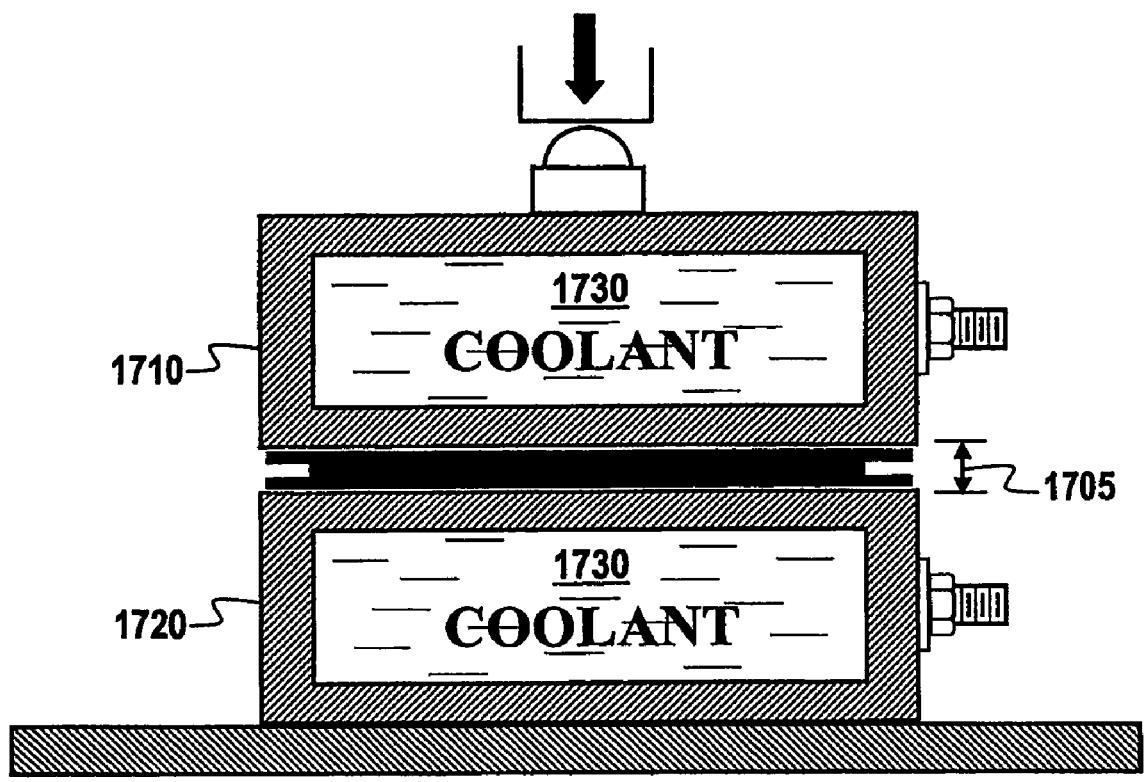
FIG. 17 illustrates another embodiment of the present invention wherein both the upper and lower contact plate utilize coolant means to maintain wafer temperature.

FIG. 17 illustrates another side perspective of upper 1710 and lower 1720 contact plates in contact with a wafer and, if used, conductive layers 1705 (analogous to pliable layer 220), wherein coolant and/or heating liquid is provided to chambers/reservoirs 1730 inside the upper and lower contact plate assemblies.

Figure 18:
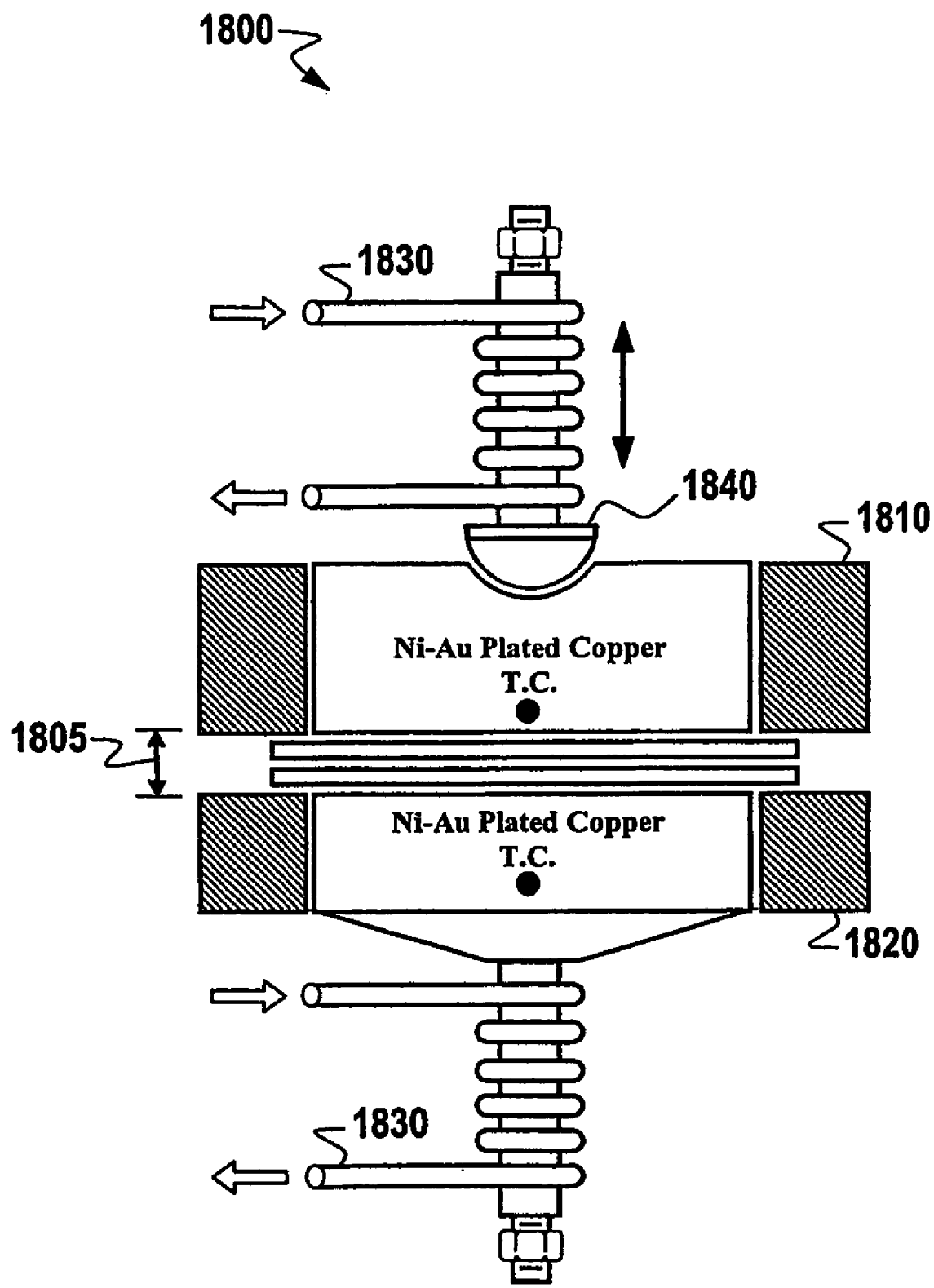

FIG. 18 illustrates yet another side perspective of a system 1800 wherein upper 1810 and lower 1820 contact plates are in contact with a wafer and, if used, conductive layers 1805 (analogous to pliable layer 220). In this case, coolant and/or heating liquid are provided to coils/tubing 1830 wrapped around shafts associated with upper 1810 and lower 1820 contact plates and assemblies through the coils/tubing 1830. Upper 1810 and lower 1820 contact plates are shown as being Ni—Au plated copper. Also shown in FIG. 18 is a hemispherical contact 1840 that provides for leveling action to the upper plate 1810 and uniform pressure with respect to the wafer 1805 being burned-in.

The embodiment and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A wafer level burn-in method, comprising the steps of:
   (a) applying electrical and physical contact using a lower contact plate to a substrate surface of a semiconductor wafer;
   (b) applying electrical and physical contact using an upper contact plate to individual contacts associated with a plurality of vertical cavity surface emitting lasers (VCSELs) borne by said semiconductor wafer;
   (c) providing electrical power to said VCSELs through said upper and lower contact plates from a power source coupled to said lower and upper contacts plates, wherein the individual contacts in contact with the upper contact plate share a common electrical contact surface of the upper contact plate and the individual contact in contact with the lower contact plate share a common electrical contact surface of the lower contact plate;
(d) monitoring and controlling electrical power to said semiconductor devices for a period set forth in accordance with a specified burn-in criteria;
(e) removing electrical power upon a completion of said period; and
(f) removing electrical and physical contact from said semiconductor wafer.

2. The method of claim 1, further comprising the step of monitoring controlling thermal energy generated at said semiconductor wafer by further providing a heat exchanger mechanism to at least one of said upper or said lower contact plates.

3. The method of claim 2, wherein said thermal control is provided through application of liquid coolant to at least one of said upper or said lower contact plates.

4. The method of claim 2, wherein said thermal control is provided through application of air coolant to at least one of said upper or lower second contact plates.

5. The method of claim 2, wherein said thermal control is provided through application of a heat sink coolant to at least one of said upper or said lower contact plates.

6. The method of claim 1, further comprising providing an electrically and thermally conductive material between at least one of:
said upper contact plate and said semiconductor devices; and
said lower contact plate and said substrate;
wherein said conductive material is pliable and provides enhanced electrical, physical and thermal contact to said semiconductor devices.

7. The method of claim 1, further including the step of allowing said semiconductor wafer to assume room temperature prior to step (f).

8. The method of claim 1, further comprising the step of providing thermal control to said semiconductor devices and said semiconductor wafer during steps (c) and (d) in accordance with said specific burn-in criteria.

9. The method of claim 8, wherein said thermal control is provided through application of a liquid coolant to at least one of said first or said second contact plates.

10. The method of claim 8, wherein said thermal control is provided through application of a heat sink coolant to at least one of said upper or said lower contact plates.

11. The method of claim 8 wherein said thermal control is provided by monitoring thermal energy of at least one of said upper contact plate and said lower contact plate.

12. The method of claim 11 wherein said monitoring is carried out using a thermocouple in thermal contact with at least one of said upper contact plate and said lower contact plate.

13. A wafer level burn-in method, comprising the steps of:
(a) applying electrical and physical contact using a lower contact plate to a substrate surface of a semiconductor wafer;
(b) applying electrical and physical contact using an upper contact plate to an individual contact for a plurality of semiconductor devices borne by said semiconductor wafer;
(c) providing electrical power to said semiconductor devices through said upper and lower second contact plates from a power source coupled to said upper and lower contact plates;
(d) monitoring and controlling electrical power to said semiconductor devices for a period set forth in accordance with a specified burn-in criteria;

(e) monitoring and controlling thermal energy generated at said semiconductor wafer by further providing a heat exchanger mechanism to at least one of said upper or said lower contact plates;
(f) removing electrical power at completion of said period;
(g) removing electrical and physical contact to said semiconductor wafer and;
(h) providing a pliable material between said plurality of semiconductor devices and said lower contact prior to performing step (a) and/or providing a pliable material between said plurality of semiconductor devices and said upper contact plate prior to performing step (b), the pliable material being in direct physical contact as well as electrical and thermal conductivity with the plurality of semiconductor devices and the upper contact plate.

14. The method of claim 13 wherein said thermal control is provided by monitoring thermal energy of at least one of said upper contact plate or said lower contact plate.

15. The method of claim 14 wherein said monitoring is carried out using a thermocouple in thermal contact with at least one of said upper contact plate and said lower contact plate.

16. The method of claim 15, wherein said thermal control is provided through application of a liquid coolant mechanism to at least one of said upper or said lower contact plates.

17. The method of claim 15, wherein said thermal control is provided through application of a liquid coolant mechanism to at least one of said upper or said lower contact plates.

18. The method of claim 15, wherein said thermal control is provided through application of a heat sink coolant mechanism to at least one of said upper or said lower contact plates.

19. The method of claim 13, further including the step of allowing said semiconductor wafer to assume room temperature prior to step (f).

20. The method of claim 14 wherein said monitoring is carried out using a thermocouple in thermal contact with at least one of said upper contact plate and said lower contact plate.

21. The method of claim 20, wherein said thermal control is provided through application of liquid coolant means to at least one of said upper or said lower contact plates.

22. The method of claim 20, wherein said thermal control is provided through application of air coolant means to at least one of said upper or said lower contact plates.

23. The method of claim 20, wherein said thermal control is provided through application of heat sink coolant mechanism to at least one of said upper or said lower contact plates.

24. A method for providing a wafer level burn-in processor to a semiconductor wafer bearing a plurality of semiconductor devices and having a lower surface and an upper surface, said upper surface further comprising electrical contacts for said semiconductor device borne by said wafer and said lower surface further comprising a common contact for said semiconductor device, the method comprising the steps of:
(a) providing a wafer level burn-in system including a lower contact plate, an upper contact plate, an electrical power source and a thermal energy controller;
(b) placing said semiconductor wafer to rest on the lower contact plate of the wafer level burn-in system, causing electrical contact between said lower contact plate and a lower surface of said semiconductor wafer;
(c) closing said upper contact plate toward said semiconductor wafer at rest on said lower contact plate until physical and electrical contact is achieved with an upper surface of said wafer;
(d) applying electrical power from said electrical power source to said upper contact plate and said lower contact plate, wherein said upper contact plate includes a common contact surface for contacting multiple semiconductor devices of the wafer simultaneously and providing a common source of electrical power to the multiple semiconductor devices without alignment of individual contacts of the upper contact plate with individual contacts of the semiconductor devices, wherein electrical current is then enabled to flow from said upper contact plate through said upper surface comprising an electrical contact for the semiconductor device to said lower contact plate through said lower surface;

(e) applying a thermal energy level to said semiconductor wafer from said thermal energy controller, wherein thermal energy is provided to said semiconductor device and said semiconductor wafer from said thermal energy controller through at least one of said contact plates;

(f) monitoring wafer level burn-in of said semiconductor wafer during a specified burn-in period;

(g) removing electrical voltage and thermal energy upon completion of said burn-in period;

(h) allowing said semiconductor wafer to cool;

(i) opening said upper contact plate away from said semiconductor wafer; and (j) removing said semiconductor wafer from said wafer level burn-in system; and (k) providing a pliable material between said plurality of semiconductor devices and said lower contact prior to performing step (d) and/or providing a pliable material between said plurality of semiconductor devices and said upper contact plate prior to performing step (d), the pliable material being in direct physical contact as well as electrical and thermal conductivity with the plurality of semiconductor devices and the upper contact plate.

25. The method of claim 24, wherein said monitoring of said wafer level burn-in includes the step of monitoring of thermal energy at said semiconductor wafer, wherein said monitoring of thermal energy is carried out using a thermocouple in thermal contact with at least one of said upper contact plate and said lower contact plate.

26. The method of claim 25, wherein said thermal energy controller provides thermal control through application of liquid coolant to at least one of said upper or said lower contact plates.

27. The method of claim 25, wherein said thermal energy controller provides thermal control through application of air coolant to at least one of said upper or said lower contact plates.

28. The method of claim 25, wherein said thermal energy controller provides thermal control through application of heat sink control to at least one of said upper or said lower contact plates.

* * * * *